(12) United States Patent
Tsunoda et al.

(10) Patent No.: US 7,166,889 B2
(45) Date of Patent: Jan. 23, 2007

(54) SEMICONDUCTOR MEMORY DEVICE HAVING A GATE ELECTRODE AND A METHOD OF MANUFACTURING THEREOF

(75) Inventors: Hiroaki Tsunoda, Mie-ken (JP); Hideyuki Kobayashi, Kanagawa-ken (JP); Yoshiaki Himeno, Mie-ken (JP); Katsuyasu Shiba, Mie-ken (JP); Jota Fukuhara, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/396,463

(22) Filed: Mar. 26, 2003

(65) Prior Publication Data

US 2004/0013009 A1 Jan. 22, 2004

(30) Foreign Application Priority Data

Apr. 4, 2002 (JP) .............................. 2002-102818

(51) Int. Cl.
*H01L 29/788* (2006.01)
(52) U.S. Cl. .............................. 257/321; 257/E29.242; 438/264
(58) Field of Classification Search ........ 257/296–310, 257/321; 438/238–386
See application file for complete search history.

(56) References Cited

U.S. PATENT DOCUMENTS 5,343,514 A * 8/1994 Snyder ..................... 379/93.01
5,656,519 A    8/1997 Mogami
5,895,239 A    4/1999 Jeng et al.
5,953,609 A * 9/1999 Koyama et al. ............. 438/253
6,040,605 A * 3/2000 Sano et al.

(Continued)

FOREIGN PATENT DOCUMENTS

JP        02-281663       11/1990

(Continued)

*Primary Examiner*—Evan Pert
(74) *Attorney, Agent, or Firm*—Oblon, Spivak, McClelland, Maier & Neustadt, P.C.

(57) ABSTRACT

A first aspect of the present invention is providing a non-volatile semiconductor memory device, comprising: a memory cell having a tunnel oxide layer formed on a semiconductor substrate, a floating gate formed on the tunnel oxide layer, a control gate to which voltage is supplied, a source diffusion layer and a drain diffusion layer, the source and drain diffusion layers formed in the semiconductor substrate adjacent to the tunnel oxide layer; a contact layer connected to the drain diffusion layer; and a layer formed above the memory cell, the layer comprising at least one of: 1) a silicon oxide layer to which nitrogen are doped, 2) a silicon oxide layer to which aluminum are doped, 3) an aluminum oxide layer, 4) a silicon oxide layer to which titanium are doped, 5) a silicon oxide layer to which two of nitrogen, aluminum, and titanium are doped, 6) a silicon oxide layer to which nitrogen, aluminum, and titanium are doped, 7) a titanium oxide layer, 8) a titanium and aluminum oxide layer, 9) a simple metal layer comprising one of Ti, Ni, Co, Zr, Cu, Pt, V, Mg, U, Nd, La, and Sc, 10) an alloy layer comprising at least two of Ti, Ni, Co, Zr, Cu, Pt, V, Mg, U, Nd, La, and Sc, and the at least two of Ti, Ni, Co, Zr, Cu, Pt, V, Mg, U, Nd, La, and Sc being included 50% or more, 11) a nitrogenous layer of the alloy layer, and 12) a hydrogenated layer of the alloy layer.

44 Claims, 19 Drawing Sheets

U.S. PATENT DOCUMENTS

| | | | |
|---|---|---|---|
| 6,104,430 A * | 8/2000 | Fukuoka | |
| 6,137,179 A | 10/2000 | Huang | |
| 6,144,060 A * | 11/2000 | Park et al. | |
| 6,242,299 B1 | 6/2001 | Hickert | |
| 6,258,649 B1 | 7/2001 | Nakamura et al. | |
| 6,301,155 B1 * | 10/2001 | Fujiwara | 365/185.18 |
| 6,342,712 B1 | 1/2002 | Miki et al. | |
| 6,479,343 B1 * | 11/2002 | Hwang et al. | 438/253 |
| 6,528,413 B2 * | 3/2003 | Hashimi | |
| 6,548,108 B1 | 4/2003 | Lohwasser et al. | |
| 6,593,190 B2 * | 7/2003 | Lee et al. | 438/262 |
| 6,618,072 B2 * | 9/2003 | Naito | 348/14.07 |
| 6,635,913 B2 | 10/2003 | Miki et al. | |
| 6,653,201 B2 * | 11/2003 | Chung | |
| 6,693,321 B1 * | 2/2004 | Zheng et al. | |
| 2001/0006239 A1 | 7/2001 | Yang et al. | |

FOREIGN PATENT DOCUMENTS

| | | |
|---|---|---|
| JP | 04-177761 | 6/1992 |
| JP | 5-63208 | 3/1993 |
| JP | 09-331031 | 12/1997 |
| JP | 11-087633 | 3/1999 |
| JP | 11-284067 | 10/1999 |
| JP | 2000-260888 | 9/2000 |
| JP | 2001-015703 | 1/2001 |
| JP | 2001-028404 | 1/2001 |
| JP | 2001-223342 | 8/2001 |
| WO | WO98/31053 | 7/1998 |
| WO | WO 0124237 A1 | 4/2001 |

* cited by examiner

SEMICONDUCTOR MEMORY DEVICE HAVING A GATE ELECTRODE AND A METHOD OF MANUFACTURING THEREOF

CROSS-REFERENCE TO RELATED APPLICATION

This application is based upon and claims the benefit of priority from the prior Japanese Patent Application No.2002-102818, filed Apr. 4, 2002, the entire contents of which are incorporated herein by reference.

BACKGROUND OF THE INVENTION

1. Field of the Invention

This present invention relates to a semiconductor memory device having a gate electrode and a method of manufacturing thereof, for example, a nonvolatile semiconductor memory device with a floating gate.

2. Description of the Related Art

Hereinafter, we will explain about a conventional technique and problems thereof with accompanying drawings.

FIG. 18a shows a cross sectional view of a conventional nonvolatile semiconductor memory device. FIG. 18b shows a cross sectional view of the conventional nonvolatile semiconductor memory device perpendicular direction to the FIG. 18a. As shown in FIGS. 18a and 18b, in the conventional nonvolatile memory device, silicon oxide layers 123, 128, 131, and 133, a silicon nitride layer 134, and a poly imide resin layer 135 is laminated above memory cells 200.

It is noted that the memory cell 200 has first and second gate insulation layers 112 and 116, a floating gate that comprises first and second poly crystalline silicon layers 114 and 115, a control gate that comprises a third poly crystalline silicon layer 117, a tungsten (W) silicide layer 118, a silicon oxide layer 119 that is used as a mask layer, and diffusion layers 300. A silicon nitride layer 121 is formed so as to cover the memory cells 200. An insulation layer 122 is fulfilled among the memory cells 200.

FIGS. 19 to 24 show cross sectional views of manufacturing steps of the conventional nonvolatile semiconductor memory device. These FIGS. 19 to 24 are cross sectional views in same direction as the FIG. 18b. Hereinafter, we will explain about a method of manufacturing of the conventional nonvolatile semiconductor memory device.

As shown in FIG. 19, by using a well-known technique, memory cells are formed on a semiconductor substrate 111. Element isolation layers 113 that have a STI (Shallow Trench Isolation) structure are formed in order to isolate among element regions (See FIG. 18a).

As shown in FIG. 20, a second silicon oxide layer 120 with a thickness of, for instance, 10 nm is formed on side surfaces of first to third poly crystalline silicon layers 114, 115, and 117, a second gate insulation film 116, and a tungsten silicide layer 118 and on surface of a first gate insulation layer 112 by adding heat with, for instance, 800 degrees centigrade and nitrogen atmosphere followed by adding heat with oxidization atmosphere. Diffusion layers 300 which are used as source or drain regions are formed by using an ion implantation method. After that, a first silicon nitride layer 121 with a thickness of, for instance, 40 nm is formed on the first and second silicon oxide layers 119 and 120 by using a CVD (Chemical Vapor Deposition). The memory cells 200 are covered with the first silicon nitride layer 121. A first insulation film 122a that comprises a BPSG (Boron Phosphorous Silicate Glass) layer with a thickness of, for instance, 300 nm is formed on the first silicon nitride layer 121 by using a CVD method. After that, Heat with, for instance, 850 degrees centigrade and nitrogen atmosphere is added, thereby making the first insulation film 122a reflowed. A second insulation film 122b with a thickness of, for instance, 300 nm is deposited on the first insulation film 122a. And then, heat with, for instance, 850 degrees centigrade and nitrogen atmosphere is added, thereby making the second insulation film 122b reflowed. Hereinafter, the first and second insulation layer are called as a insulation layer 122.

As shown in FIG. 21, the insulation film 122 is flattened by using a CMP (Chemical Mechanical Polish) method so that an upper surface of the first silicon nitride layer 121 that is used as a stopper layer, is exposed. And then, Heat with, for instance, 850 degrees centigrade, 15 minutes, and nitrogen atmosphere, is added, thereby making the insulation layer 122 reflowd. Sequentially, heat with, for instance, 950 degrees centigrade and nitrogen atmosphere is added. A third silicon oxide layer 123 with a thickness of, for instance, 350 nm is deposed on the first silicon nitride layer 121 and the insulation layer 122 by using a plasma CVD method. And then, a photo resist layer (not shown) is processed to a predetermined pattern by using a photolithography technique. Predetermined portions of the third silicon oxide layer 123 and the insulation layer 122 are removed by using the photo resist layer as a mask and a RIE (Reactive Ion Etching) method. Thereby a first contact hole 124 is formed. After that, the photo resist layer is removed.

Portions of the first silicon nitride layer 121, the second silicon oxide layer 120, and the first gate insulation layer 112 that are formed at a bottom portion of the contact hole 124, are removed so as to expose an upper surface of the semiconductor substrate 111 by using the third silicon oxide layer 123 as a mask and a RIE method. And then, Formations on a side surface of the first contact hole 124 are removed. A fourth poly crystalline silicon layer 125 with, for instance, 300 nm in thickness is deposited in the first contact hole 124 and on the third silicon oxide layer 123 by using a low pressure CVD method. By using a CDE (Chemical Dry Etching) method, the fourth poly crystalline silicon layer 125 deposited on the third silicon oxide layer 123, is removed. After that, an upper portion of the fourth poly crystalline silicon layer 125 is removed so that an upper surface of the fourth poly crystalline silicon layer 125 is lower than that of the third silicon oxide layer 123. And then, heat with, for instance, 950 degrees centigrade and nitrogen atmosphere is added.

By using a photo lithography technique, a photo resist layer (not shown) is formed and processed to a predetermined pattern. The third silicon oxide layer 123, the insulation layer 122, and the first silicon nitride layer 121 are removed by using the photo resist layer with the predetermined pattern and a RIE method, thereby forming a second contact hole (not shown) on the semiconductor substrate 111 and a third contact hole (not shown) on the second poly crystalline silicon layer 115. Furthermore, simultaneously, the third silicon oxide layer 123, the first silicon nitride layer 121, the first silicon oxide layer 119, and the tungsten silicide layer 118 are removed, thereby forming a fourth contact hole (not shown) on the third poly crystalline silicon layer 117. After that, the photo resist layer of the predetermined pattern is removed.

As shown in FIG. 22, by using a photo lithography technique, a photo resist layer (not shown) is formed and processed to a predetermined pattern. The third silicon oxide layer 123 is removed by using the photo resist layer of the predetermined pattern and a RIE method. And then, the photo resist layer of the predetermined pattern is removed. Impurities are injected into desirable areas of the silicon substrate 111 by using an ion implantation method. The impurities injected into the silicon substrate 111 are activated with, for instance, 950 degrees centigrade and nitrogen atmosphere by using a RTA (Rapid Thermal Annealing) method. By using a PVD method, a titanium layer 126 with a thickness, for instance, of 30 nm is deposited. And then, heat is added with, for instance, 550 degrees centigrade, 90 minutes, and nitrogen atmosphere. Sequentially, by using a PVD method, a first tungsten layer 127 with a thickness, for instance, of 400 nm is deposited on the titanium layer 126. After that, by using a CMP method, the titanium layer 126 and the first tungsten layer 127 are flattened to such an extent that an upper surface of the third silicon oxide layer 123 is exposed. Heat is added with, for instance, 400 degrees centigrade, 30 minutes, and a mixture gas of hydrogen and nitrogen.

As shown in FIG. 23, a fourth silicon oxide layer 128 is deposited on the third silicon oxide layer 123, the titanium layer 126, the first tungsten layer 127. By using a photo lithography technique, a photo resist layer (not shown) is patterned. After that, the fourth silicon oxide layer 128 is processed by using the patterned photo resist layer as a mask, thereby, exposing a part of an upper surface of the tungsten layer 127. And then, the pattern photo resist layer is removed. A barrier metal layer (not shown) is formed on the first tungsten layer 127 and the fourth silicon oxide layer 128. A second tungsten layer 129 is deposited on the barrier metal layer. By using a CMP method, the barrier metal layer and the second tungsten layer 129 are flattened to such an extent to expose an upper surface of the fourth silicon oxide layer 128. Sequentially, a laminated layer 130 that comprises a barrier metal layer/an Al—Cu layer/a barrier metal layer (hereinafter, called as a first metal layer) is deposited. After that, by using a photo lithography technique, a photo resist layer (not shown) is patterned. By using the patterned photo resist layer as a mask, the first metal layer is processed. And then, the patterned photo resist layer is removed.

As shown in FIG. 24, by using a HDPCVD (High Density Plasma Chemical Vapor Deposition), a fifth silicon oxide layer 131 is deposited on the fourth silicon oxide layer 128 and the first metal layer 130. And then, by using a CMP method, the fifth silicon oxide layer 131 is flattened. A photo resist layer (not shown) is formed and patterned by using a photo lithography method. After that, the fifth silicon oxide layer 131 is removed by using the patterned photo resist layer as a mask, thereby espousing a part of an upper surface of the first metal layer 130. The patterned photo resist layer is removed. And then, a laminated layer (hereinafter called as a second metal layer 132) comprising a barrier metal layer and the Al—Cu layer is deposited. Sequentially, a photo resist layer (not shown) is formed on the second layer 132 and patterned by using a photo lithography method. After that, the second metal layer 132 is removed by using a patterned photo resist layer as a mask.

As shown in FIGS. 18a and 18b, by using a plasma CVD method, a sixth silicon oxide layer 133 is formed on the fifth silicon oxide layer 131 and the second metal layer 132. And then, heat is added with, for instance, 400 degrees centigrade and a mixture gas of hydrogen and nitrogen. Sequentially, by using plasma CVD method, a second silicon nitride layer 134 is formed on the fifth silicon oxide layer 131, a poly imide resin layer 135 is deposited on the second silicon nitride layer 134. Sequentially, After making an anneal with, for instance, 350 degrees centigrade, the poly imide resin layer 35, the second silicon nitride layer 134, and the sixth silicon oxide layer 133 are removed, thereby exposing a part of an upper surface of the second metal layer 132.

In the conventional memory device that is manufactured as mentioned above, a characteristic declines remarkably at a repeat test of a date reprogramming operation. Specifically, in a data retention test that is performed after the repeat test of date reprogramming operation, an alteration of "0" data (a situation where minus charged electrons are stored in the floating gate) into "1" data occurs. Therefore, it is difficult that the guaranteed number of a reprogramming test is increased. It is noted that the data retention test is defined as a test for evaluating quickly at a high temperature.

SUMMARY OF INVENTION

A first aspect of the present invention is providing a non-volatile semiconductor memory device, comprising: a memory cell having a tunnel oxide layer formed on a semiconducor substrate, a floating gate formed on the tunnel oxide layer, a control gate to which voltage is supplied, a source diffusion layer and a drain diffusion layer, the souce and drain diffusion layers formed in the semiconductor substrate adjacent to the tunnel oxide layer; a contact layer connected to the drain diffusion layer; and a layer formed above the memory cell, the layer comprising at least one of: 1) a silicon oxide layer to which nitrogen are doped, 2) a silicon oxide layer to which aluminum are doped, 3) an aluminum oxide layer, 4) a silicon layer to which titanium are doped, 5) a silicon oxide layer to which two of nitrogen, aluminum, and titanium are doped, 6) a silicon oxide layer to which nitrogen, aluminum, and titanium are doped, 7) a titanium oxide layer, 8) a titanium and aluminum oxide layer, 9) a simple metal layer comprising one of Ti, Ni, Co, Zr, Cu, Pt, V, Mg, U, Nd, La, and Sc, 10) an alloy layer comprising at least two of Ti, Ni, Co, Zr, Cu, Pt, V, Mg, U, Nd, La, and Sc, and the at least two of Ti, Ni, Co, Zr, Cu, Pt, V, Mg, U, Nd, La, and Sc being included 50% or more, 11) a nitrogenous layer of the alloy layer, and 12) a hydrogenated layer of the alloy layer.

A second aspect of the present invention is providing a method of manufacturing a non-volatile semiconductor memory device, comprising: forming a source diffusion layer and a drain diffusion layer in a semiconductor substrate: forming a tunnel oxide layer on the semiconductor substrate adjacent to the source and the drain diffusion layers: forming a floating gate above the tunnel oxide layer; forming a control gate above the floating gate; and forming a layer formed above the memory cell, the layer comprising at least one of: 1) a silicon oxide layer to which nitrogen are doped, 2) a silicon oxide layer to which aluminum are doped, 3) an aluminum oxide layer, 4) a silicon oxide layer to which titanium are doped, 5) a silicon oxide layer to which two of nitrogen, aluminum, and titanium are doped, 6) a silicon oxide layer to which nitrogen, aluminum, and titanium are doped, 7) a titanium oxide layer, 8) a titanium and aluminum oxide layer, 9) a simple metal layer comprising one of Ti, Ni, Co, Zr, Cu, Pt, V, Mg, U, Nd, La, and Sc, 10) an alloy layer comprising at least two of Ti, Ni, Co, Zr, Cu, Pt, V, Mg, U, Nd, La, and Sc, and the at least two of Ti, Ni, Co, Zr, Cu, Pt, V, Mg, U, Nd, La, and Sc being included 50% or more, 11) a nitrogenous layer of the alloy layer, and 12) a hydrogenated layer of the alloy layer.

BRIEF DESCRIPTION OF THE DRAWINGS

FIG. 1b shows a cross sectional view perpendicular to a non-volatile semiconductor memory device shown in FIG. 1a.

FIG. 8 shows a cross sectional view of a non-volatile semiconductor memory device of a second embodiment in a present invention. FIG. 8b shows a cross sectional view perpendicular to a non-volatile semiconductor memory device shown in FIG. 8a.

FIG. 13 shows a cross sectional view of a non-volatile semiconductor memory device of a third embodiment in a present invention. FIG. 13b shows a cross sectional view perpendicular to a non-volatile semiconductor memory device shown in FIG. 13a.

FIG. 16 shows a cross sectional view of a non-volatile semiconductor memory device of a fourth embodiment in a present invention. FIG. 16b shows a cross sectional view perpendicular to a non-volatile semiconductor memory device shown in FIG. 16a.

FIG. 18b shows a cross sectional view perpendicular to a non-volatile semiconductor memory device shown in FIG. 18a.

DETAILED DESCRIPTION OF THE INVENTION

When we investigated a cause that data retention characteristic of the conventional non-volatile semiconductor memory device is lowered, we understood that the main cause would be hydrogen that invades from outside or exists on the way of manufacturing the non-volatile semiconductor memory device. Therefore, in a first embodiment of a present invention, a layer to capture the hydrogen or to prevent the hydrogen from diffusing is formed above a non-volatile semiconductor memory device in order to upgrade the data retention characteristic.

Hereinafter, embodiments of the present invention will be explained with reference to accompanying drawings. A common reference number will be assigned for common portions over the whole accompanying drawings.

(First Embodiment)

In the first embodiment of the present invention, the layer to capture the hydrogen or prevent the hydrogen from diffusing is $Al_2O_3$ (Aluminum oxide) layer. The $Al_2O_3$ (Aluminum oxide) layer is formed above the non-volatile semiconductor memory device.

Figure 1B:
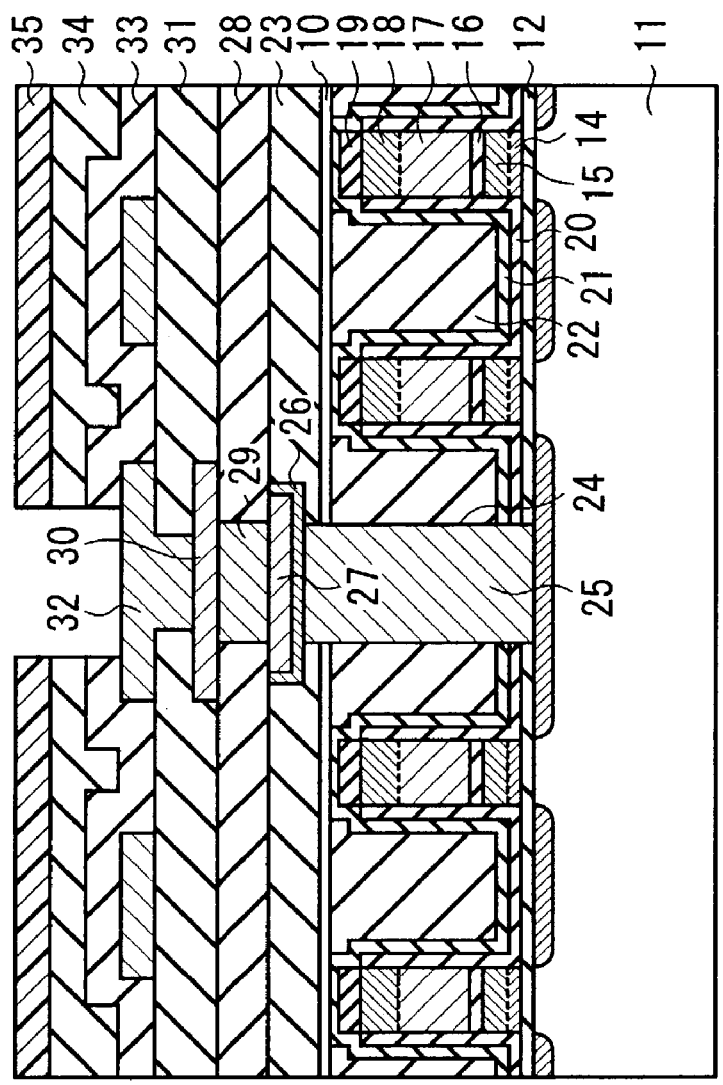
Figure 1A:
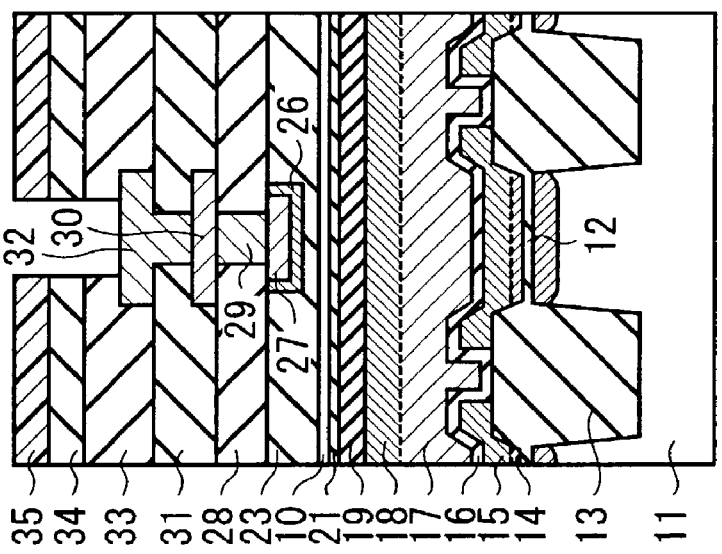
FIG. 1a shows a cross sectional view of a non-volatile semiconductor memory device of a first embodiment in a present invention.

FIG. 1a shows a cross sectional view of the non-volatile semiconductor memory device of the first embodiment in the present invention. FIG. 1b shows a perpendicular cross sectional view of the FIG. 1a. Hereinafter, a structure and a manufacturing method of the first embodiment in the present invention will be explained.

As shown in FIGS. 1a and 1b, the non-volatile semiconductor memory device of the present invention has an $Al_2O_3$ (Aluminum oxide) layer 10 to capture the hydrogen or to prevent the hydrogen from diffusing above the non-volatile semiconductor memory device. The $Al_2O_3$ (Aluminum oxide) layer 10 is formed between the non-volatile semiconductor memory device and a second metal layer 32.

The non-volatile semiconductor memory device has first and second gate insulating films 12 and 16, a floating gate of first and second polycrystalline silicon layers 14 and 15, a control gate of a third polycrystalline silicon layer 17, a tungsten (W) silicide layer 18, and a first silicon oxide 19 used as a mask layer of a gate electrode that comprises the floating gate, the control gate, and the tungsten (W) silicide layer 18. A first silicon oxide layer 21 is formed to cover the non-volatile semiconductor memory device. An insulating film 22 is buried among the non-volatile semiconductor memory devices. The $Al_2O_3$ layer 10 is formed on a silicon nitride layer 21 that is formed on the first silicon oxide 19, and the insulating layer 22 that is buried among the non-volatile semiconductor memory devices.

FIGS. 2 through 15 show cross sectional views in which a manufacturing method of the non-volatile semiconductor memory device of the first embodiment in the present invention is depicted. The FIGS. 2 through 15 show cross sectional views in same direction as FIG. 1b. Hereinafter, the manufacturing method of the non-volatile semiconductor memory device of the first embodiment in the present invention will be explained.

Figure 2:
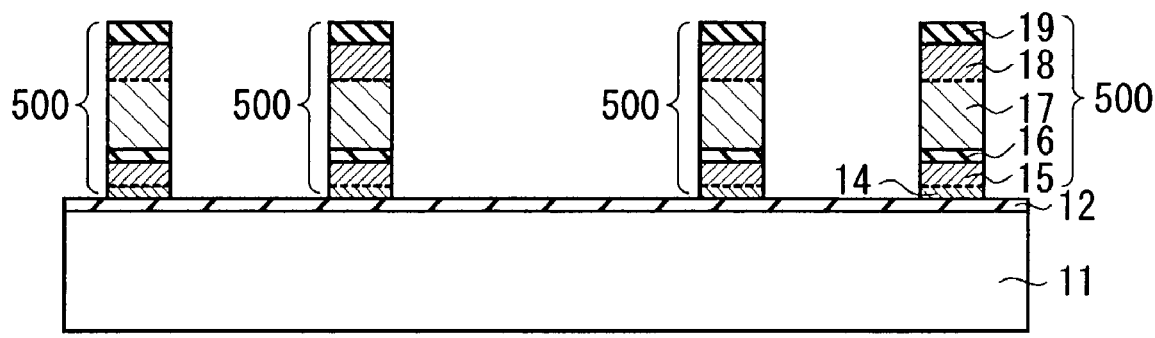
FIG. 2 shows a manufacturing step of a non-volatile semiconductor memory device associated with the first embodiment of the present invention.

As shown in FIG. 2, a gate insulation film 12 is formed on a semiconductor substrate 11. The gate electrodes 500 are formed on the gate insulation film 12. As mentioned above, each of the gate electrode 500 is comprised of the floating gate of the first and second polycrystalline silicon layers 14 and 15, the second gate insulation film 16, the control gate of the third polycrystalline silicon layer 17, and the tungsten (W) silicide layer 18. The first silicon oxide 19 is formed on the tungsten (W) silicide layer 18. In order to isolate an element region, element isolation insulation layers 13 each of which has a STI (Shallow Trench Isolation) structure are formed (FIG. 1a).

Figure 3:
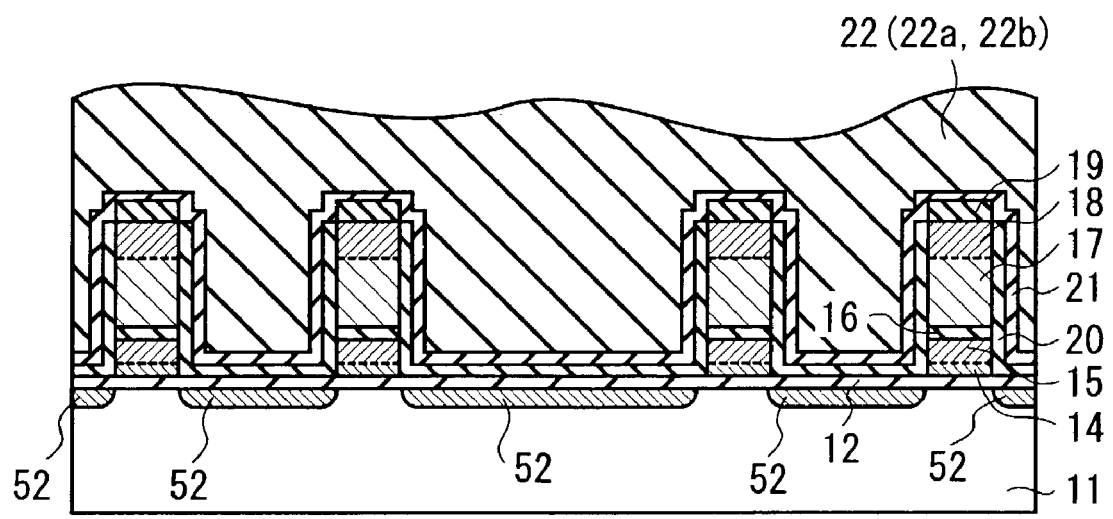
FIG. 3 shows a manufacturing step of a non-volatile semiconductor memory device associated with the first embodiment of the present invention followed by FIG. 2.

As shown in FIG. 3, heat is added with, for instance, 800 degrees centigrade and nitrogen atmosphere. Sequentially, heat is add with oxide atmosphere, thereby forming a second silicon oxide layer 20 with, for instance, a thickness of 10 nm on surfaces of the first to third poly crystalline silicon layer 14, 15, and 17, the second gate insulation film 16, and the tungsten silicide layer 18, and on upper surface of the first gate insulation layer 12. And then, by using an ion implantation method, impurities are implanted to areas of source and drain regions 52. By using a low pressure CVD (Chemical Vapor Deposition), a silicon nitride layer 21 with, for instance, a thickness of 40 nm is formed on the first and second silicon layer 19 and 20. Thereby, the non-volatile semiconductor memory devices are covered with the first silicon nitride layer 21. And then, by using a CVD method, a first insulation layer 22a of a BPSG (Boron Phosphorous Silicon Glass) layer with, for instance, a thickness of 300 nm is formed on the first silicon nitride layer 21. After that, heat is added with, for instance, 850 degrees centigrade and nitrogen atmosphere. Thereby, the insulation film 22a is reflowed. A second insulation film 22b with, for instance, 850 degrees centigrade and nitrogen atmosphere is formed on the first insulation film 22a. After that, heat is added with, for instance, 850 degrees centigrade and nitrogen atmosphere. Thereby, the second insulation layer 22b is reflowed. Hereinafter, the first and second insulation layer 22a and 22b are referred as a insulation layer 22.

Figure 4:
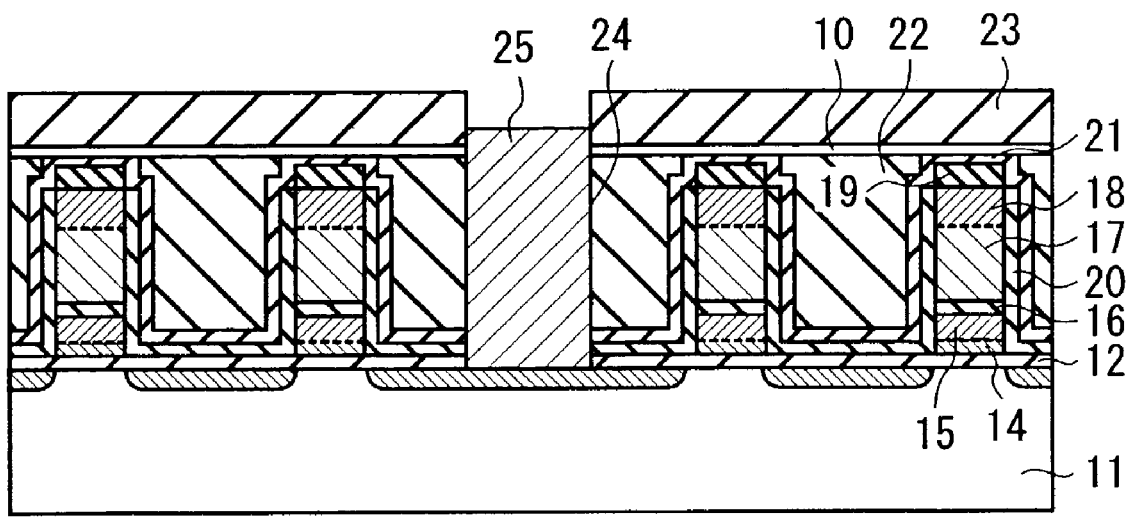
FIG. 4 shows a manufacturing step of a non-volatile semiconductor memory device associated with the first embodiment of the present invention followed by FIG. 3.

As shown in FIG. 4, by using a CMP (Chemical Mechanical Polish) method, the insulation layer 22 is flattened to such an extent that an upper surface of the first silicon nitride layer 21 that is used as a stopper layer is exposed. After that, heat is added with, for instance, 850 degrees centigrade, 15 minutes, and nitrogen atmosphere. Thereby, the insulation layer 22 is reflowed. Sequentially, heat is added with, for instance, 950 degrees centigrade and nitrogen atmosphere. By using a PVD (Physical Vapor Deposition) method, the $Al_2O_3$ (Aluminum oxide) layer 10 with, for instance, a thickness of 10 nm is formed on the insulation layer 22. A third silicon oxide layer 23 with, for instance, a thickness of 350 nm is formed on the $Al_2O_3$ layer 10 by using a plasma CVD method. After a resist layer (not shown) is processed into a predetermined pattern by using a photo lithography technique, predetermined portions of the third silicon oxide layer 23, the $Al_2O_3$ layer 10, and the insulation layer 22 are removed to form a first contact hole 24 by using the patterned resist layer as a mask, and a RIE (Reactive Ion Etching) method. After that, the patterned resist layer is removed.

The first silicon nitride layer 21, the second silicon oxide layer 20, and the first gate insulation film 12 which are formed on a bottom portion of the first contact hole 24, are removed so as to expose an upper surface of the semiconductor substrate 11 by using a RIE method and the third silicon oxide layer 23 as a mask. After that, formation that is formed on a side surface of the first contact hole 24 is removed. By using a low pressure CVD method, a fourth poly crystalline silicon layer 25 with, for instance, a thickness of 300 nm is formed in the first contact hole 24 and on the third silicon oxide layer 23. By using a CDE (Chemical Dry Etching) method, the fourth poly crystalline silicon layer 25 that is formed on the third silicon oxide layer 23, is removed. And then, an upper portion of the fourth poly crystalline silicon layer 25 is removed so that an upper surface of the fourth poly crystalline silicon layer 25 is lower than that of the third silicon oxide layer 25. Also, heat is added with, for instance, 950 degrees centigrade and nitrogen atmosphere.

By using a photolithography technique, a resist layer (not shown) is formed and patterned with a predetermined pattern. And then, by using a RIE method and the patterned resist layer as a mask, the third silicon oxide layer 23, the insulation layer 22, and the first silicon nitride layer 21 are removed, thereby forming a second contact hole (not shown), which reaches the upper surface of the semiconductor substrate 11. At same time, the third silicon oxide layer 23, the insulation layer 22, and the first silicon nitride layer 21 are removed, thereby forming a third contact hole (not shown), which reaches the upper surface of the second poly crystalline silicon layer 15. Furthermore, at same time, the third silicon oxide layer 23, the first silicon nitride layer 21, the first silicon oxide layer 19, and the tungsten silicide layer 18 are removed, thereby forming a fourth contact hole (not shown), which reaches the upper surface of the third poly crystalline silicon layer 15.

Figure 5:
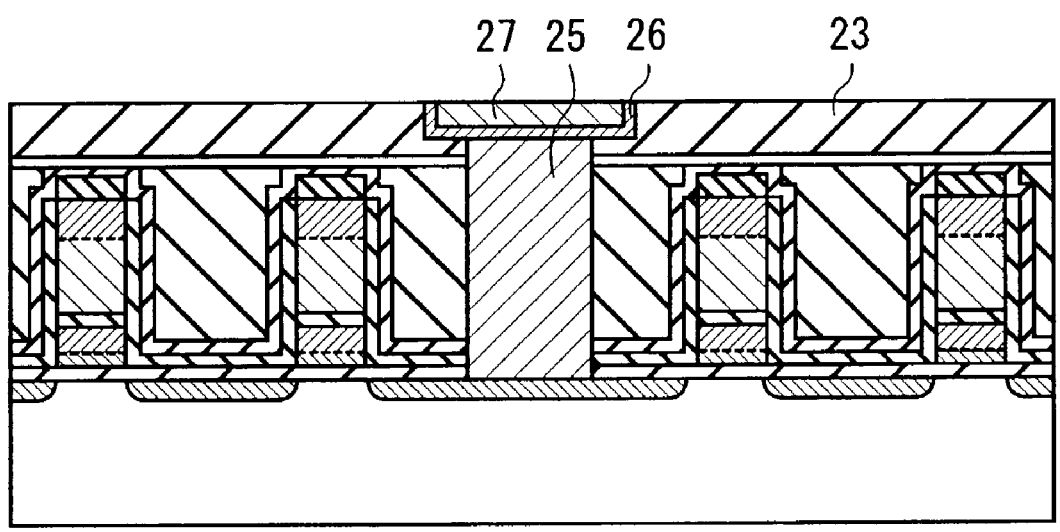
FIG. 5 shows a manufacturing step of a non-volatile semiconductor memory device associated with the first embodiment of the present invention followed by FIG. 4.

As shown in FIG. 5, by using a photolithography technique, a resist layer (not shown) is formed and patterned with a predetermined pattern. And then, by using a RIE method and the patterned resist layer as a mask, the third silicon oxide layer 23 is removed. After that, the patterned resist layer is removed. Impurities are injected into a desirable area by using an ion implantation method. And then, heat is added by using a RTA (Rapid Thermal Annealing) method with, for instance, 950 degrees centigrade and nitrogen atmosphere, thereby activating the impurities injected. By using a PVD method, a Ti (titanium) layer 26 with, for instance, a thickness of 30 nm is formed. Heat is added with, for instance, 550 degrees centigrade, 90 minutes, and nitrogen atmosphere containing hydrogen. Sequentially, a first W (tungsten) layer 27 with, for instance, a thickness of 400 nm is formed on the Ti layer 26 by using a PVD method. After that, the Ti layer 26 and the first W layer 27 is flattened to such an extent that an upper surface of the third silicon oxide layer 23 is exposed by using a CMP method. Also, heat is added with, for instance, 400 degrees centigrade, 30 minutes, and a mixture gas of hydrogen and nitrogen.

Figure 6:
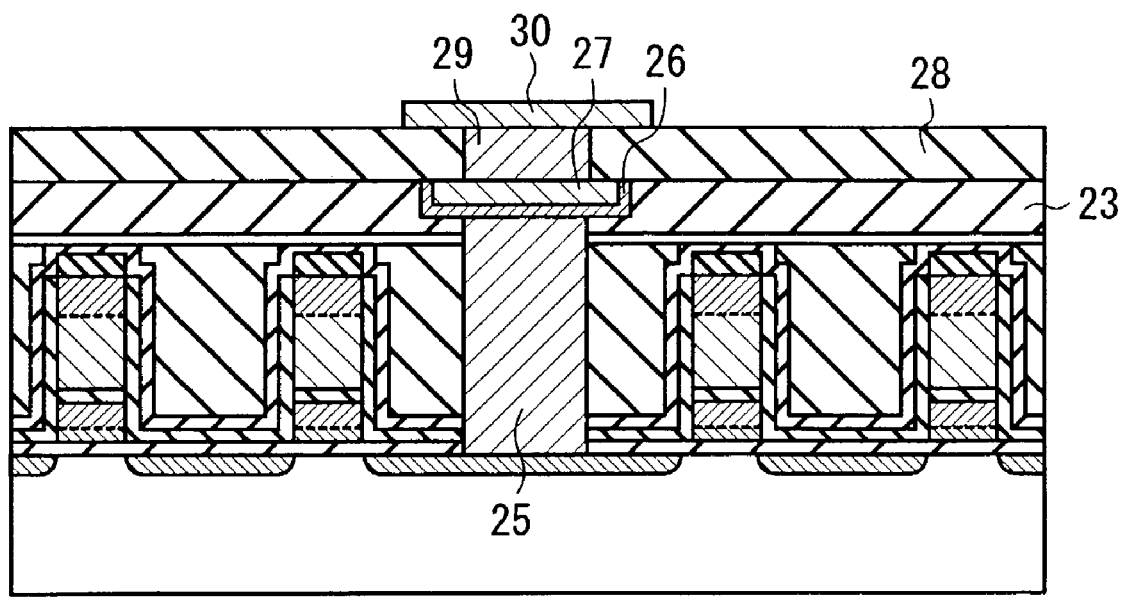
FIG. 6 shows a manufacturing step of a non-volatile semiconductor memory device associated with the first embodiment of the present invention followed by FIG. 5.

As shown in FIG. 6, a fourth silicon oxide layer 28 is formed on the third silicon oxide layer 23, the Ti layer 26, and the first W layer 27. By using a photolithography technique, a resist layer (not shown) is formed and patterned. After that, the fourth silicon oxide layer 28 is removed by using the patterned resist layer as a mask, thereby exposing a portion of an upper surface of the first W layer 27. The resist layer patterned is removed. A barrier metal (not shown) is formed on the first W layer 27 and the fourth silicon oxide layer 28. A second W layer 29 is formed on the barrier metal. After that, by using a CMP method, the barrier metal and the second W layer 29 are flattened to such an extent that an upper surface of the fourth silicon oxide layer 28 is exposed. A laminated layer 30 that is comprised of a barrier metal layer/an Al—Cu layer/a barrier metal layer (hereinafter, referred as a first metal layer), is formed. After that, by using a photolithography technique, a resist layer (not shown) is formed and patterned. By using the patterned resist layer as a mask, the metal layer 30 is processed. After that, the resist layer patterned is removed.

Figure 7:
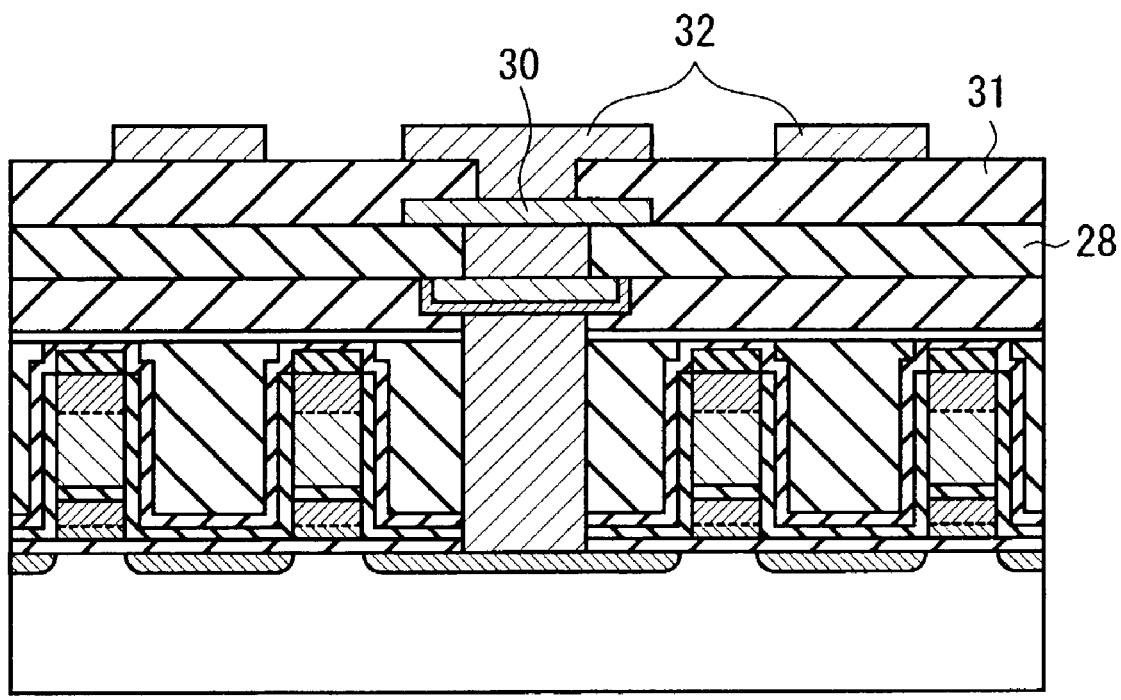
FIG. 7 shows a manufacturing step of a non-volatile semiconductor memory device associated with the first embodiment of the present invention followed by FIG. 6.

As shown in FIG. 7, by using a HDPCVD (High Density Plasma Chemical Vapor Deposition) method, a fifth silicon oxide layer 31 is formed on the fourth silicon oxide layer 28 and the first metal layer 30. After that, by using a CMP method, the fifth silicon oxide layer 31 is flattened. By using a photolithography technique, a resist layer (not shown) is formed and patterned. And then, by using the patterned resist layer as a mask, the fifth silicon oxide layer 31 is processed, thereby exposing a portion of an upper surface of the first metal layer 30. After that, the resist layer patterned is removed. And then, a laminated layer 32 that is comprised of a barrier metal layer/an Al—Cu layer (hereinafter, referred as a second metal layer), is formed. After that, by using a photolithography technique, a resist layer (not shown) is formed and patterned. By using the patterned resist layer as a mask, the second metal layer 32 is processed. After that, the resist layer patterned is removed.

As shown in FIGS. 1a and 1b, by using a plasma CVD method, a sixth silicon oxide layer 33 is formed on the fifth silicon oxide layer 31 and the second metal layer 32. After that, heat is added with, for instance, 400 degrees centigrade and a mixture gas of hydrogen and nitrogen. By using a plasma CVD method, a second silicon nitride layer 34 is formed on the fifth silicon oxide layer 31. And then, a poly imide resin 35 is formed on the second silicon nitride layer 34. After annealing with, for instance, 350 degrees centigrade, portions of the poly imide resin 35, the second silicon nitride layer 34, and the sixth silicon oxide layer 33 are removed, thereby exposing a portion of an upper surface of the second metal layer 32.

In the first embodiment, an instance of forming the $Al_2O_3$ layer 10 above the non-volatile semiconductor memory device is shown. However, a layer that is formed above the non-volatile semiconductor memory device would not be limited to the $Al_2O_3$ layer 10 and may be a layer that prevents hydrogen from diffusing (containing a layer that captures hydrogen). The layer that prevents hydrogen from diffusing may be a layer as follows.

A first example of the layer that prevents hydrogen from diffusing is a silicon oxide layer to which nitride are doped. The silicon oxide layer to which nitride are doped may be formed by injecting nitrogen atoms into a silicon oxide layer with, for instance, acceleration energy 25 KeV and dose quantity $1 \times 10^{15}$ $cm^{-2}$. Also, the silicon oxide layer to which nitride are doped may be formed by a CVD method that can use gas with nitrogen and without hydrogen, for instance, $N_2O$ or $NF_3$ etc. The silicon oxide layer to which nitride are doped may be formed by adding heat with, for instance, 800 degrees centigrade, ammonia ($NH_3$) atmosphere and 30 minutes. Also, the silicon oxide layer to which nitride may be formed by a HDPCV method.

A second example of the layer that prevents hydrogen from diffusing is a silicon oxide layer to which aluminum are doped. The silicon oxide layer to which aluminum are doped may be formed by injecting aluminum ions into a silicon oxide layer. The silicon oxide layer to which aluminum are doped may be formed by using a CVD method. Also, the silicon oxide layer to which aluminum are doped may be formed by adding heat with oxygen atmosphere after forming an alloy of Al and Si. Also, the silicon oxide layer to which aluminum are doped may be formed by using a PVD method.

A third example of the layer that prevents hydrogen from diffusing is an aluminum oxide layer. The aluminum oxide layer may be formed by using a CVD or a PVD method. Also, the aluminum oxide layer may be formed by adding heat with oxygen atmosphere after aluminum was formed.

A fourth example of the layer that prevents hydrogen from diffusing is a silicon oxide layer to which titanium are doped. The silicon oxide layer to which titanium are doped may be formed by injecting titanium ions into a silicon oxide layer. Also, the silicon oxide layer to which titanium are doped may be formed by using a CVD method.

A fifth example of the layer that prevents hydrogen from diffusing is a silicon oxide layer to which two of nitrogen, aluminum, and titanium are doped.

A sixth example of the layer that prevents hydrogen from diffusing is a silicon oxide layer to which nitrogen, aluminum, and titanium are doped.

A seventh example of the layer that prevents hydrogen from diffusing is a titanium oxide layer. The titanium oxide layer may be formed by a PVD method. The titanium oxide layer may be formed by adding heat with oxygen atmosphere after forming a titanium layer.

An eighth example of the layer that prevents hydrogen from diffusing is a titanium and aluminum oxide layer.

A ninth example of the layer that prevents hydrogen from diffusing is a simple metal layer comprising one of Ti, Ni, Co, Zr, Cu, Pt, V, Mg, U, Nd, La, and Sc. Alternatively, the layer that prevents hydrogen from diffusing may be an alloy layer comprising at least two of Ti, Ni, Co, Zr, Cu, Pt, V, Mg, U, Nd, La, and Sc, and the at least two of Ti, Ni, Co, Zr, Cu, Pt, V, Mg, U, Nd, La, and Sc are included 50% or more. Alternatively, the layer that prevents hydrogen from diffusing may be a nitrogenous layer of the alloy layer. Alternatively, the layer that prevents hydrogen from diffusing may be a hydrogenated layer of the alloy layer. To give a few actual examples, the layer that prevents hydrogen from diffusing is, for instance, TiNi, Ti—Co, Ti—Cu, Ni—Zr, Ti—Pt, or Zr—Cu etc.

In the first embodiment of the present invention, the $Al_2O_3$ layer is formed above the memory cell, thereby preventing hydrogen from intruding into the memory cell. A data retention test after programming a data to the memory cell, which is a test for measuring a time period in which data is stored in the memory cell programmed, results in 0.3 V or less of fluctuations in threshold voltage in the first embodiment as opposed to about 0.5 V of that in a conventional technique. Like this, the first embodiment of the present invention allows a characteristic of the data retention to make good.

It is noted that instead of the third silicon oxide layer 23, a silicon oxide layer to which nitrogen is doped can be used. The silicon oxide layer to which nitrogen are doped is formed by a CVD method at which $SiH_4$, $N_2O$, and $N_2$ are used. In this case, the silicon oxide layer to which nitrogen are doped can prevent furthermore hydrogen from intruding into the memory cell, thereby making an improvement of the data retention characteristic.

(A Second Embodiment)

A second embodiment of the present invention is different from the first embodiment of the present invention in that an $Al_2O_3$ layer is formed on a silicon oxide layer that is formed above memory cells.

Figure 8B:
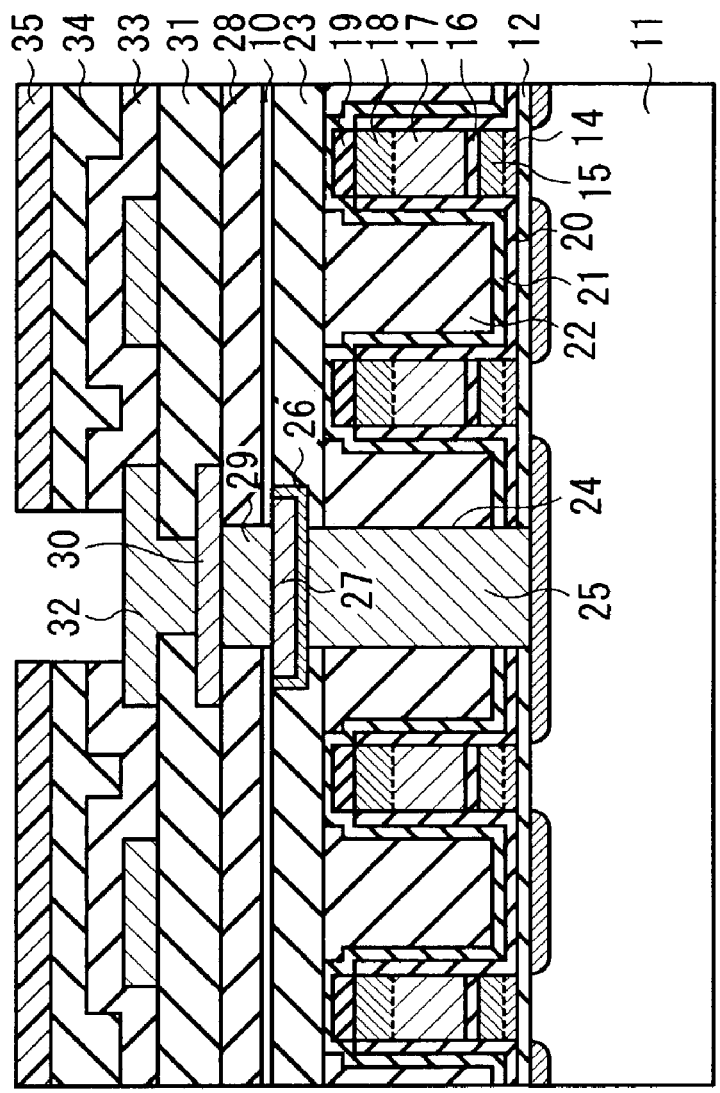
Figure 8A:
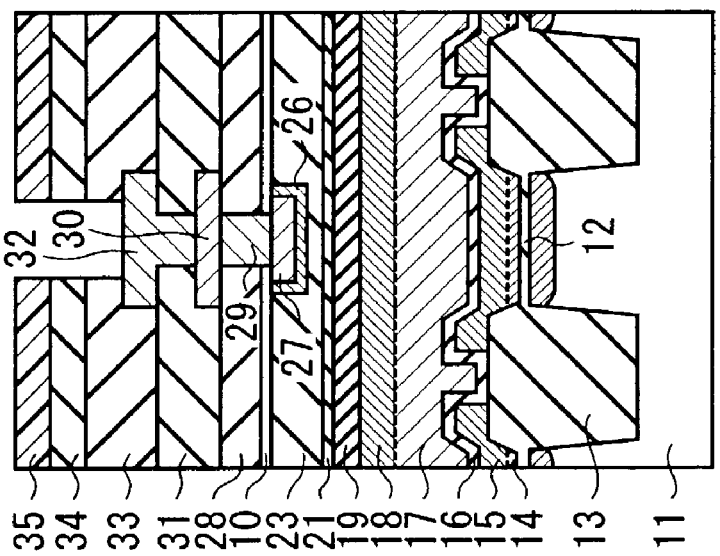

FIG. 8a shows a cross sectional view of a non-volatile semiconductor memory device of the second embodiment in the present invention. FIG. 8b shows a cross sectional view perpendicular to the non-volatile semiconductor memory device shown in FIG. 8a. Hereinafter, we will explain about a structure of the non-volatile semiconductor memory device of the second embodiment in the present invention.

As shown in FIGS. 8a and 8b, the structure of the non-volatile semiconductor memory device of the second embodiment is different from that of the first embodiment in that a $Al_2O_3$ layer 10 is formed on a third silicon oxide layer 23 that is formed above memory cells. Similarly to the first embodiment, the $Al_2O_3$ layer 10 is formed between the memory cells and a second metal layer 32.

FIGS. 9 to 12 show cross sectional views of manufacturing the non-volatile semiconductor memory device of the second embodiment in the present invention. Hereinafter, a manufacturing step of the non-volatile semiconductor memory device of the second embodiment will be explained.

Figure 9:
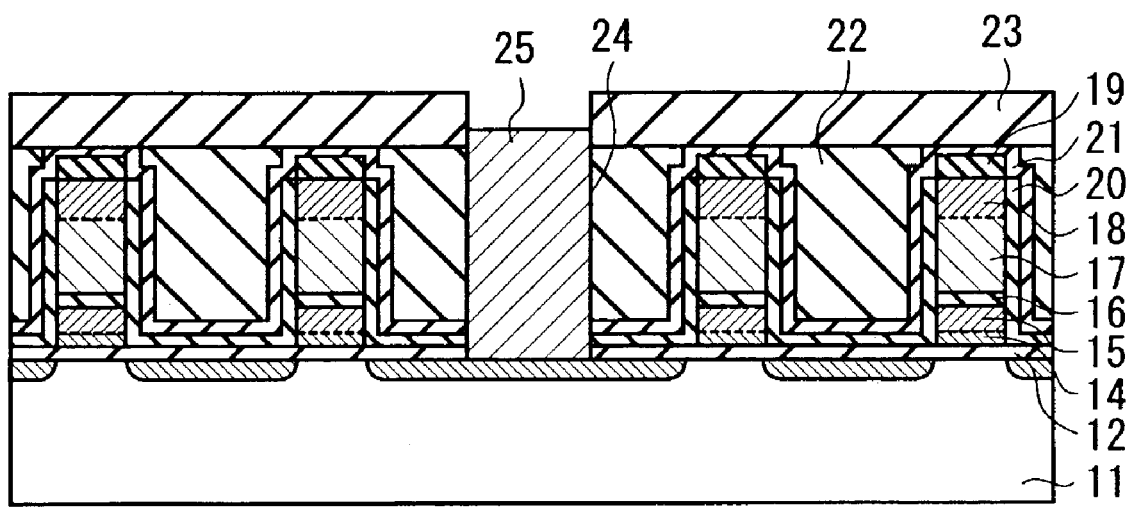
FIG. 9 shows a manufacturing step of a non-volatile semiconductor memory device associated with the second embodiment of the present invention followed by FIG. 8.

We will explain about manufacturing steps following that the insulation film 22 comprising the first insulation film 22a and the second insulation film 22b was formed, because manufacturing steps from forming the gate insulation film 12 to forming the insulation film 22 are same as that of the first embodiment (See FIGS. 2 and As shown in FIG. 9, the insulation film 22 is flattened, by using a CMP method, so as to expose an upper surface of the first silicon nitride layer 23 that is used as a stopper layer. The insulation film 22 is reflowed by adding heat with, for instance, 850 degrees centigrade, 15 minutes, and nitrogen atmosphere followed by adding heat with, for instance, 950 degrees centigrade and nitrogen atmosphere. And then, by using a plasma CVD method, a third silicon oxide layer 23 with, for instance, 350 nm in thickness is formed on the first silicon nitride layer 21 and the insulation film 22. By using a photolithography method, a resist layer (not shown) with a predetermined pattern is formed. Predetermined portions of the third silicon oxide layer 23 and the insulation film 22 are removed by using a RIE method and the patterned resist layer as a mask, thereby forming a first contact hole 24. After that, the patterned resist layer is removed.

Similarly to the first embodiment stated before, a forth polycrystalline silicon layer 25 is formed in the first contact hole after the first silicon nitride layer 21, the second silicon oxide layer 20, and the first gate insulation film 12 that are formed on a bottom of the first contact hole 24, are removed. After that, Second to fourth contact holes are formed (not shown).

Figure 10:
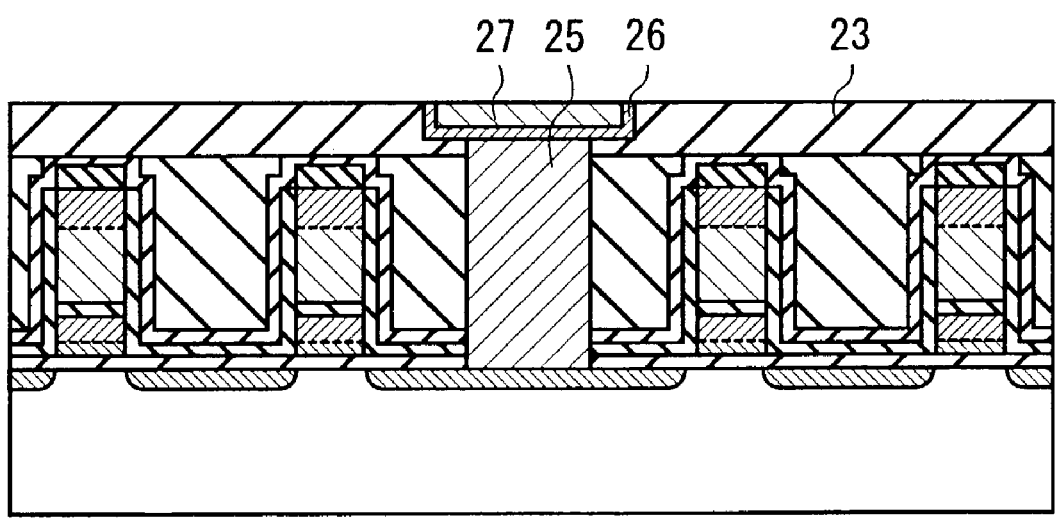
FIG. 10 shows a manufacturing step of a non-volatile semiconductor memory device associated with the second embodiment of the present invention followed by FIG. 9.

As shown in FIG. 10, a Ti layer 26 and a first W layer 27 are formed after the third silicon oxide layer 23 is processed. And then, by using a CMP method, the Ti layer 26 and the first W layer 27 are flattened so as to expose an upper surface of the third silicon oxide layer 23.

Figure 11:
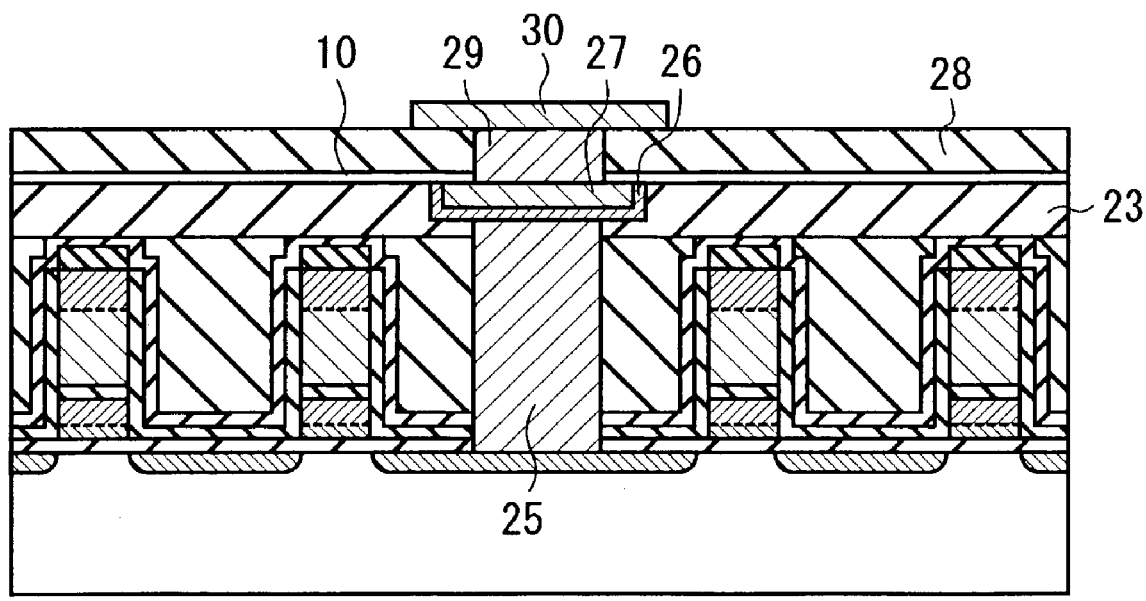
FIG. 11 shows a manufacturing step of a non-volatile semiconductor memory device associated with the second embodiment of the present invention followed by FIG. 10.

As shown in FIG. 11, by using a PVD method, an $Al_2O_3$ layer 10 with, for instance, 10 nm in thickness is formed on the third silicon oxide 23, the Ti layer 26, and the first W layer 27. A fourth silicon oxide layer 28 is formed on the $Al_2O_3$ layer 10. Portions of the fourth silicon oxide layer 28 and the $Al_2O_3$ layer 10 are removed, thereby exposing a portion of an upper surface of the first W layer 27. A second W layer 29 is formed on the first W layer 27 and the fourth silicon oxide layer 28, and then, the second W layer is flattened. A first metal layer 30 is formed on the fourth silicon oxide layer 28 and the second W layer 29. After that, the first metal layer 30 is processed.

Figure 12:
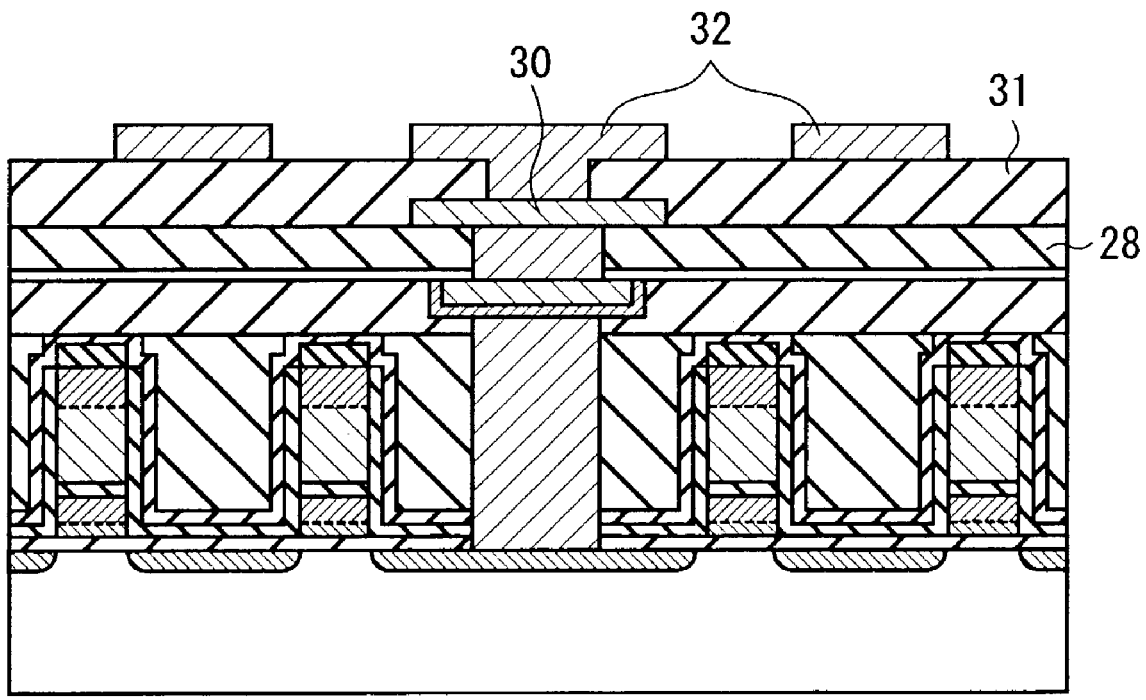
FIG. 12 shows a manufacturing step of a non-volatile semiconductor memory device associated with the second embodiment of the present invention followed by FIG. 11.

As shown in FIG. 12, by using a HDPCVD method, a fifth silicon oxide layer 31 is formed on the fourth silicon oxide layer 28 and the first metal layer 30. The fifth silicon oxide layer 31 is flattened. And then, the fifth silicon oxide layer 31 is processed, thereby exposing a portion of an upper surface of the first metal layer 30. The second metal layer 32 is formed and processed.

As shown in FIGS. 8a and 8b, a sixth silicon oxide layer 33, a second silicon nitride layer 34, and a poly imide resin layer 35 are formed. After that, the poly imide resin layer 35, the second silicon nitride layer 34, and the sixth silicon oxide layer 33 are processed, thereby exposing a portion of an upper surface of the second metal layer 32.

The second embodiment of the present invention has same effects as the first embodiment of the present invention.

It is noted that a silicon oxide layer in which nitrogen are doped could be allowed to use, instead of the fourth silicon oxide layer 28. The silicon oxide layer in which nitrogen are doped could be formed by using a plasma CVD method with, for instance, $SiH_4$, $N_2O$, and $N_2$.

(A Third Embodiment)

A third embodiment of the present invention is different from the first embodiment of the present invention in that an $Al_2O_3$ layer is formed on a silicon oxide layer that is formed above an upper lines.

Figure 13B:
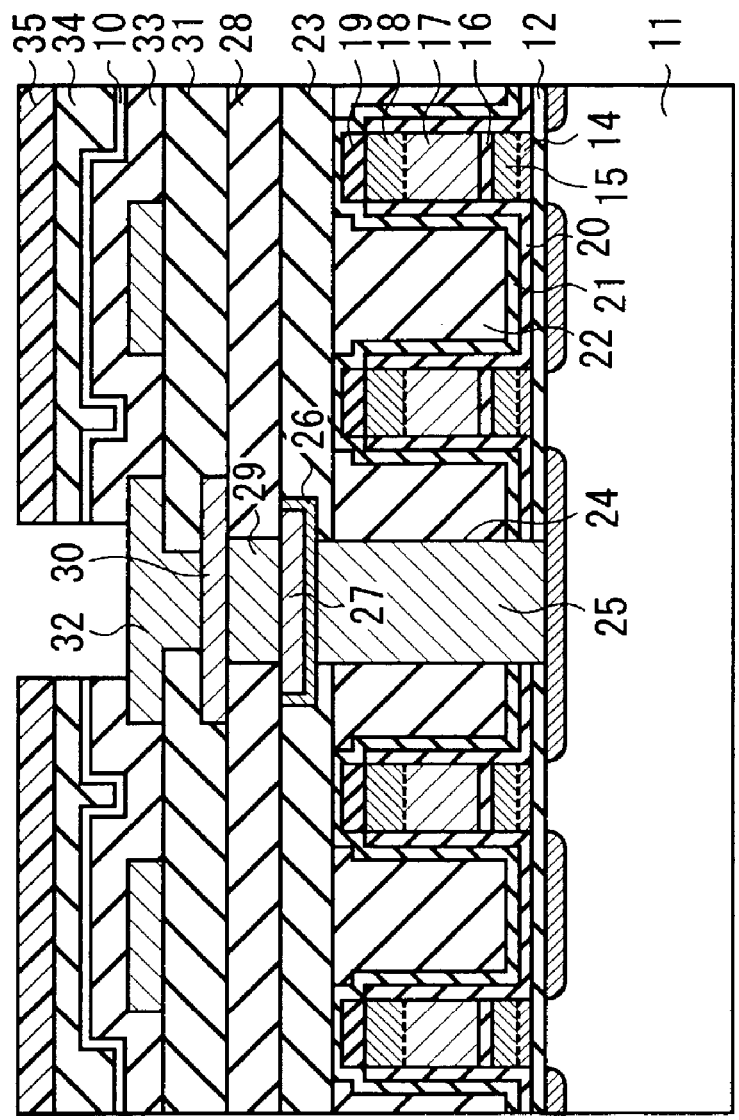
Figure 13A:
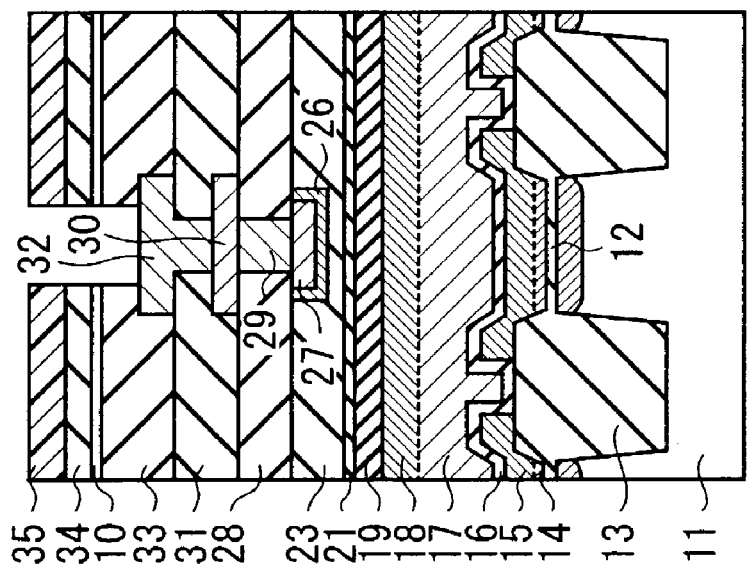

FIG. 13a shows a cross sectional view of a non-volatile semiconductor memory device of the third embodiment in the present invention. FIG. 13b shows a cross sectional view perpendicular to the non-volatile semiconductor memory device shown in FIG. 13a. Hereinafter, we will explain about a structure of the non-volatile semiconductor memory device of the third embodiment in the present invention.

As shown in FIGS. 13a and 13b, a non-volatile semiconductor memory device of the third embodiment in the present invention is different from that of the first embodiment in the present invention in that an $Al_2O_3$ layer 10 is formed on a sixth silicon oxide layer 33 that is formed on a second metal layer 32. Therefore, we will omit an explanation about a structure of the non-volatile semiconductor memory device in the third embodiment, because the structure of the non-volatile semiconductor memory device in the third embodiment is same as that of the first embodiment.

Figure 14:
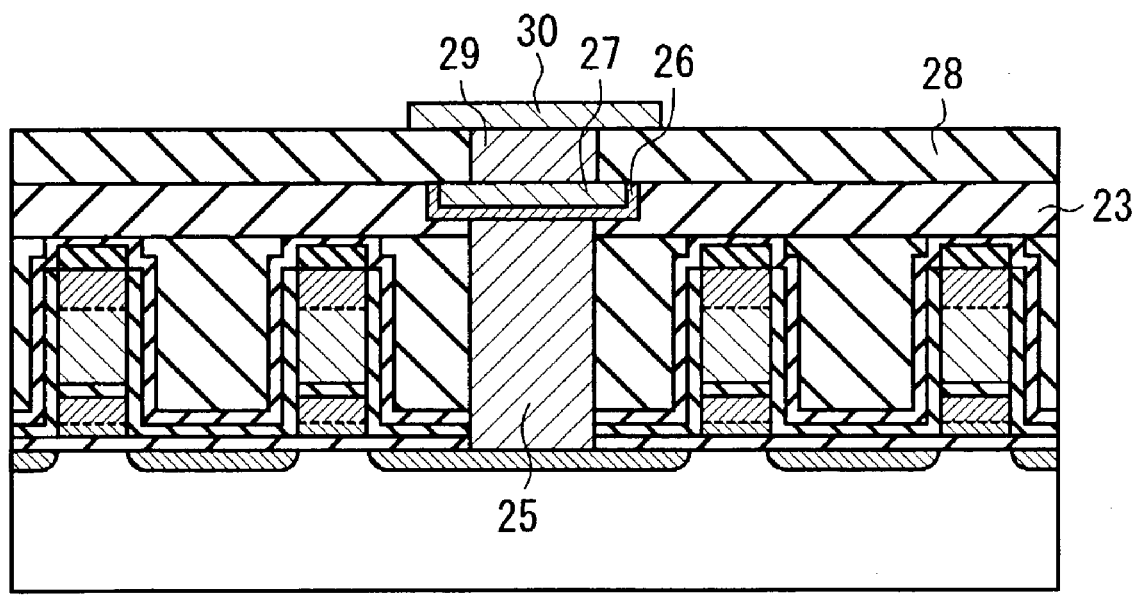
FIG. 14 shows a manufacturing step of a non-volatile semiconductor memory device associated with the third embodiment of the present invention followed by FIG. 13.
Figure 15:
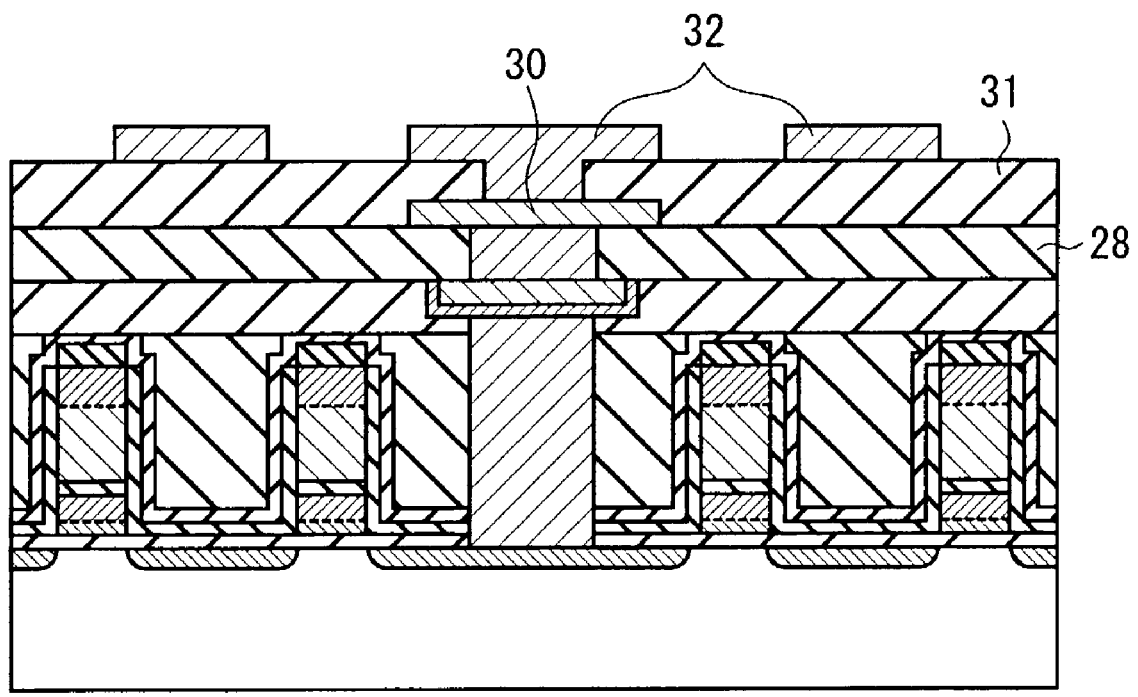
FIG. 15 shows a manufacturing step of a non-volatile semiconductor memory device associated with the third embodiment of the present invention followed by FIG. 14.

FIGS. 14 and 15 show cross sectional views of the manufacturing steps of the non-volatile semiconductor memory device of the third embodiment in the present invention. Hereinafter, we will explain about manufacturing steps of the non-volatile semiconductor memory device of the third embodiment in the present invention. Also, we will explain about the manufacturing steps of the non-volatile semiconductor memory device in the third embodiment. However, same manufacturing steps of the non-volatile semiconductor memory device in the third embodiment as that of the first embodiment would be omitted or simplified.

Fist, an explanation about manufacturing steps from forming the gate insulating film 12 to forming the Ti layer 26 and the first W layer 27 will be omitted, because the explanation is same as that of the second embodiment (See FIGS. 2, 3, 9, and 10).

As shown in FIG. 14, a fourth silicon oxide layer 28 is formed on the third silicon oxide layer 23, the Ti layer 26, and the first W layer 27. A predetermined portion of the fourth silicon oxide layer 28 is removed so as to expose a portion of an upper surface of the first W layer 27. A second W layer 29 is formed on the first W layer 27 and the fourth silicon oxide layer 28. And then, the second W layer 29 is flattened. After that, the first metal layer 30 is formed and processed.

As shown in FIG. 15, by using a HDPCVD method, a fifth silicon oxide layer 31 is formed on the fourth silicon oxide layer 28 and the first metal layer 30, and then, the fifth silicon oxide layer 31 is flattened. After that, a predetermined portion of the fifth silicon oxide layer 31 is removed so as to expose a portion of an upper surface of the first metal layer 30. A second metal layer 32 is formed and processed.

As shown in FIGS. 13a and 13b, by using a HDPCVD method, a sixth silicon oxide layer 33 with, for instance, 900 nm in thickness is formed on the fifth silicon oxide layer 31 and the second metal layer 32 followed by adding heat with, for instance, 400 degrees centigrade and mixture gas of hydrogen and nitrogen. By using a PVD method, an $Al_2O_3$ layer 10 with, for instance, 10 nm in thickness is formed on the sixth silicon oxide layer 33. And then, by using a plasma CVD method, a second silicon nitride layer 34 is formed on the fifth silicon nitride layer 31. A poly imide resin layer 35 is formed on the second silicon nitride layer 34. The poly imide resin layer 35 is annealed, and then predetermined portions of the poly imide resin layer 35, the second silicon nitride 34, and the sixth silicon oxide layer 33 is removed, thereby exposing a portion of an upper surface of the second metal layer 32.

The third embodiment of the present invention has same effects as the first embodiment of the present invention.

It is noted that a silicon oxide layer in which nitrogen are doped could be allowed to use, instead of the sixth silicon oxide layer 33. The silicon oxide layer in which nitrogen are doped could be formed by using a plasma CVD method with, for instance, $SiH_4$, $N_2O$, and $N_2$. Alternatively, The silicon oxide layer in which nitrogen are doped could be formed by using a HDPVCD method with, for instance, $SiH_4$, $N_2O$, and $N_2$.

(A Fourth Embodiment)

Figure 16B:
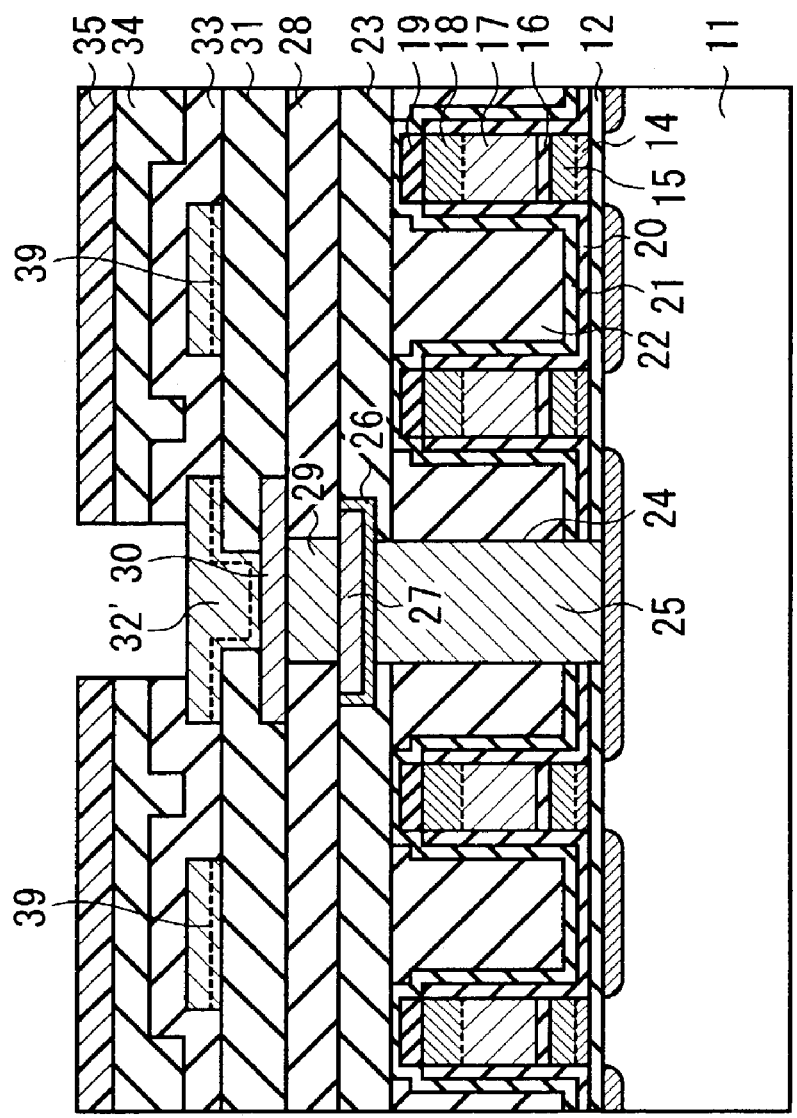
Figure 16A:
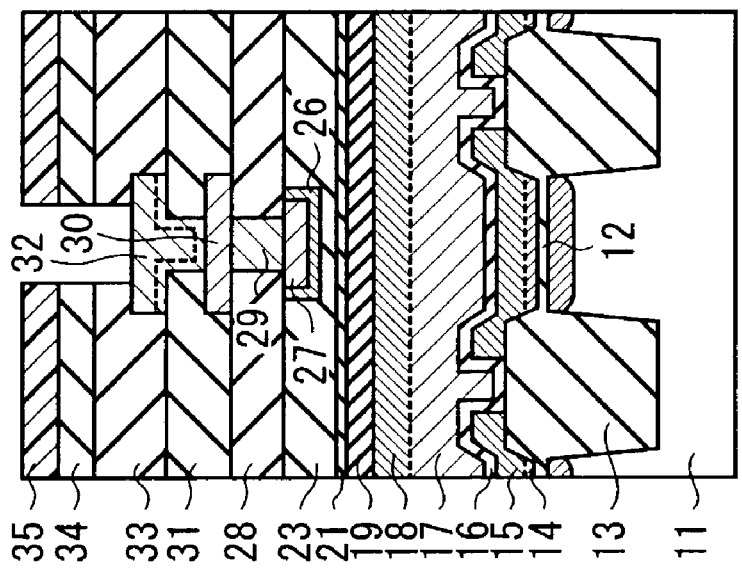

In a fourth embodiment of the present invention, an upper line layer and a layer that captures hydrogen or prevents hydrogen from diffusing, are laminated FIG. 16a shows a cross sectional view of a non-volatile semiconductor memory device of the fourth embodiment in the present invention. FIG. 16b shows a cross sectional view perpendicular to the non-volatile semiconductor memory device shown in FIG. 16a. Hereinafter, we will explain about a structure of the non-volatile semiconductor memory device of the fourth embodiment in the present invention.

As shown in FIGS. 16a and 16b, a non-volatile semiconductor memory device of the fourth embodiment in the present invention is different from that of the first embodiment in the present invention in that a third metal layer 32' is a laminated layer that comprises a Ti layer/a TiN layer/a Al—Cu layer. The third layer 32' (the laminated layer) could have not only a function of capturing hydrogen or preventing hydrogen from diffusing, as stated before in the first embodiment, but also a function of a conducting layer. It is desirable to provide not only the third layer 32' that is electrically connected to the first metal layer 30, but also conducting layers 39 that are electrically separated. An explanation of the other structures of the fourth embodiment in the present invention will be omitted, because they are same as that of the first embodiment in the present invention.

Figure 17:
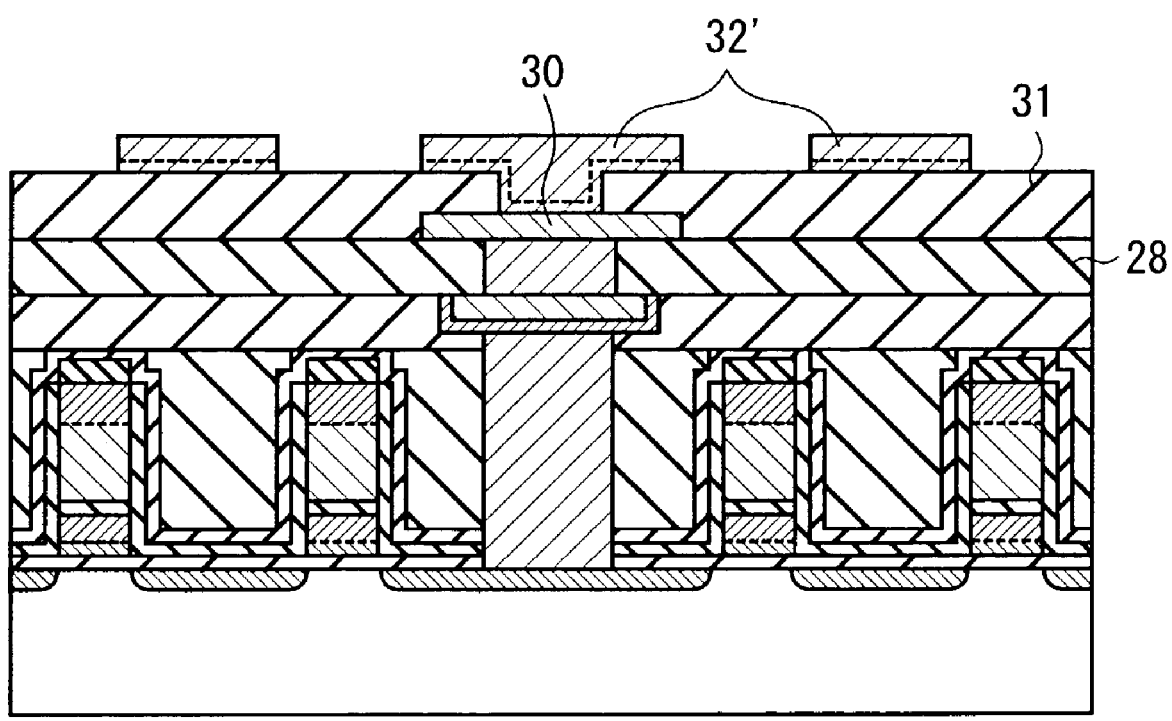
FIG. 17 shows a manufacturing step of a non-volatile semiconductor memory device associated with the fourth embodiment of the present invention followed by FIG. 16.
Figure 18B:
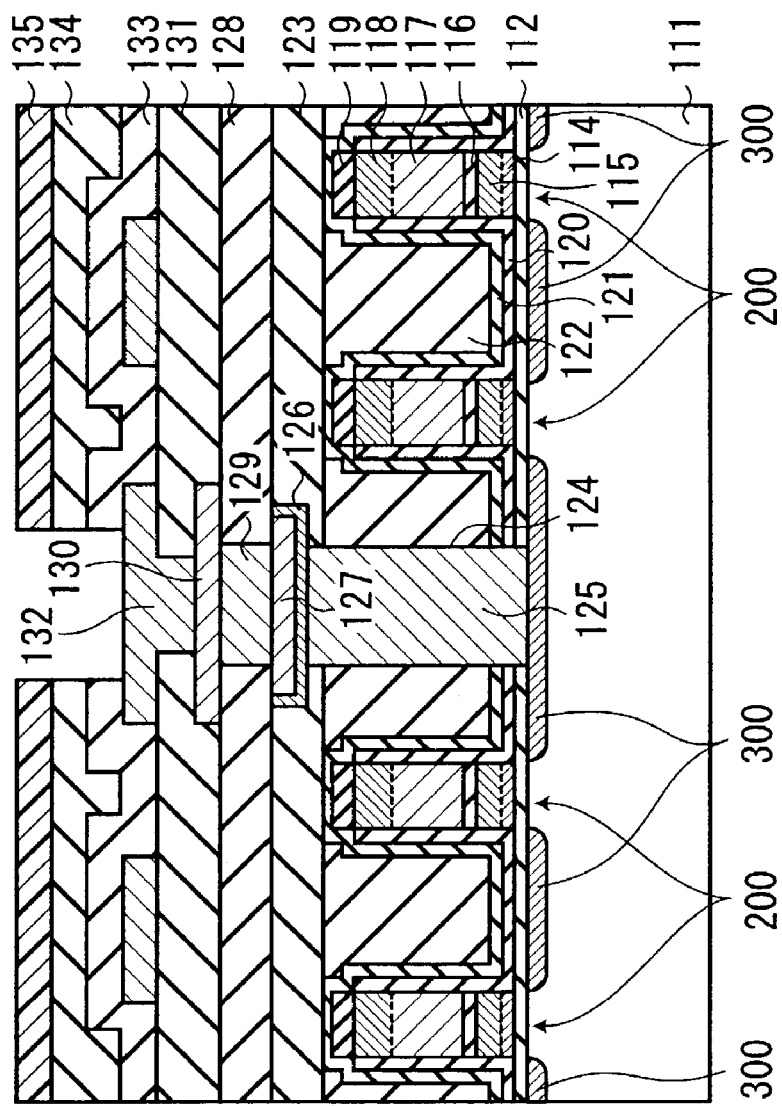
Figure 18A:
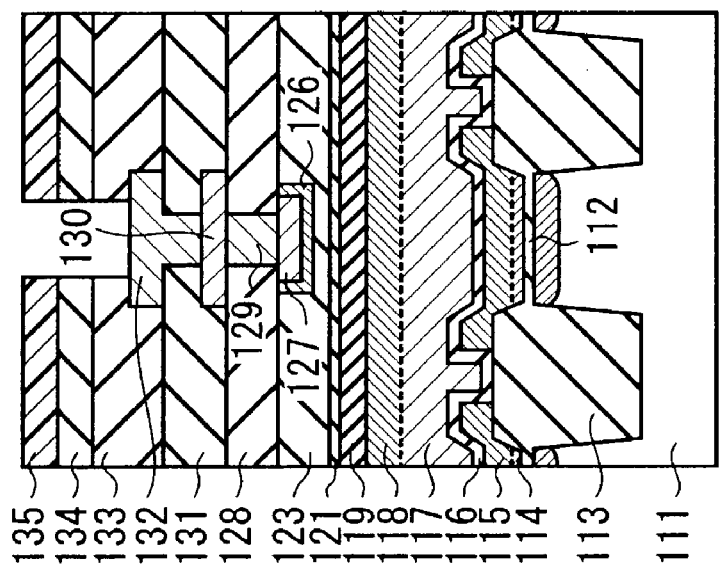
FIG. 18a shows a cross sectional view of a conventional non-volatile semiconductor memory device.
Figure 19:
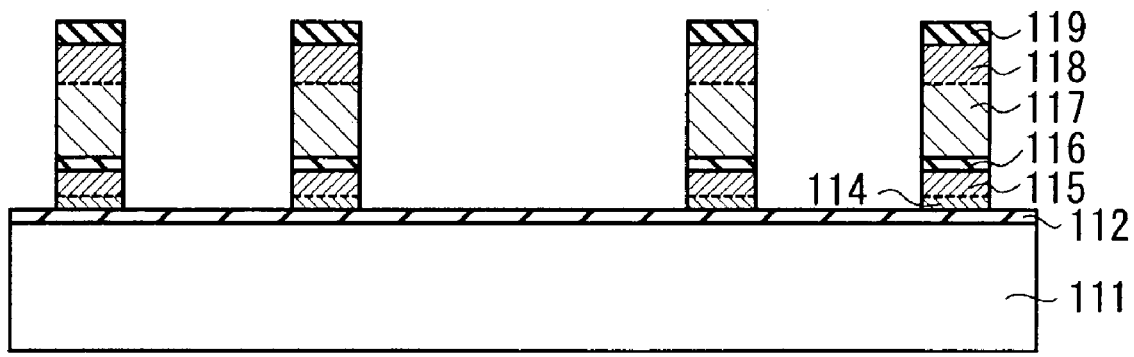
FIG. 19 shows a manufacturing step of the conventional non-volatile semiconductor memory device.
Figure 20:
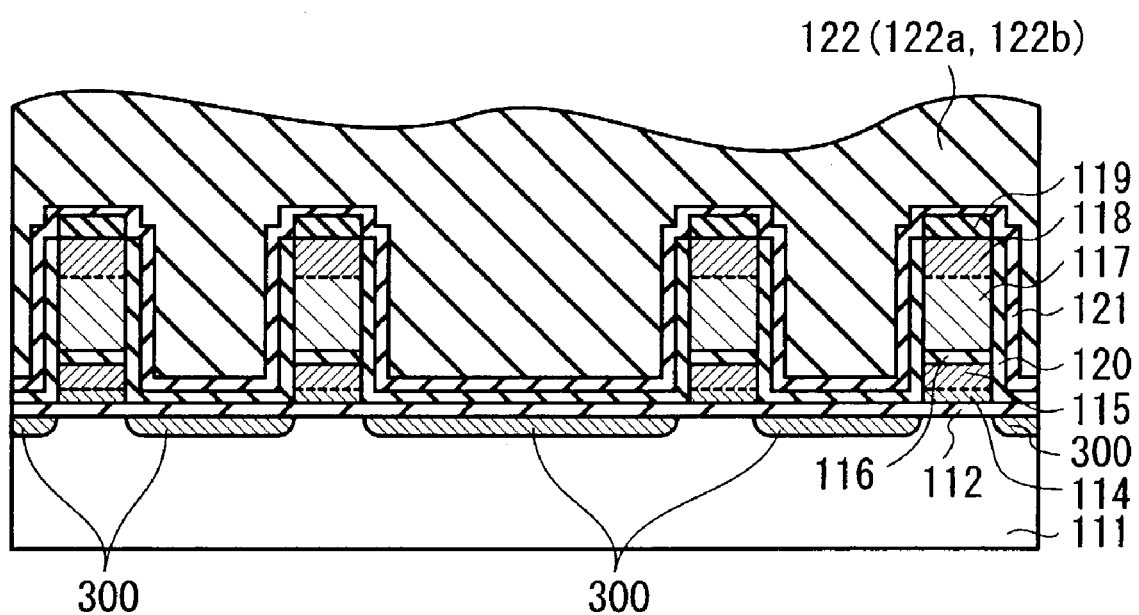
FIG. 20 shows a manufacturing step of a conventional non-volatile semiconductor device followed by FIG. 19.
Figure 21:
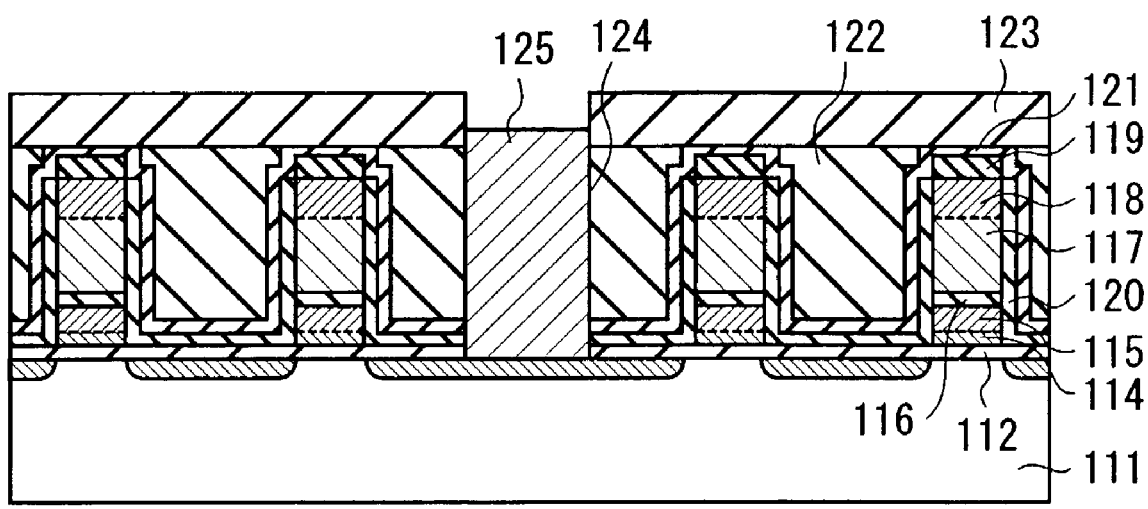
FIG. 21 shows a manufacturing step of a conventional non-volatile semiconductor device followed by FIG. 20.
Figure 22:
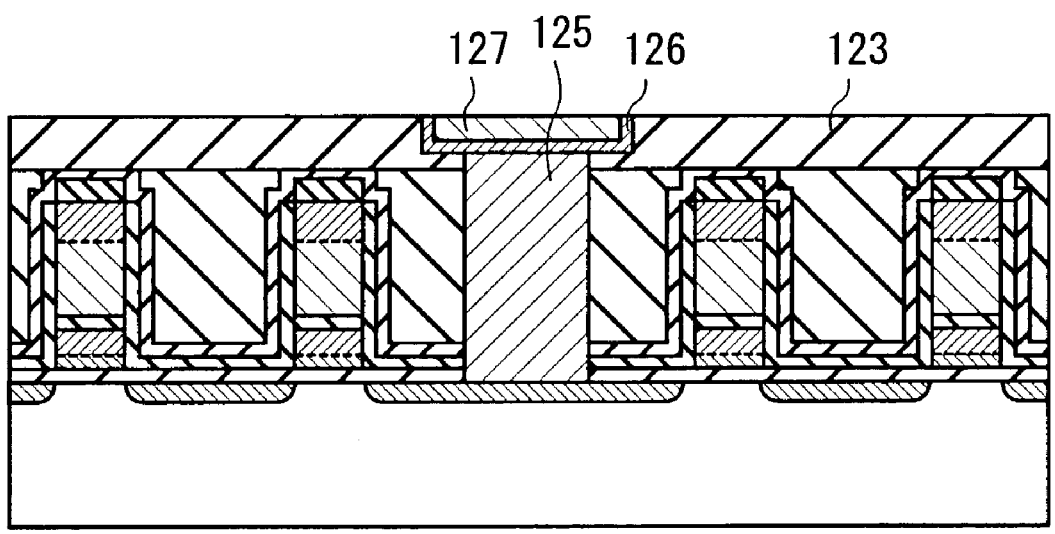
FIG. 22 shows a manufacturing step of a conventional non-volatile semiconductor device followed by FIG. 21.
Figure 23:
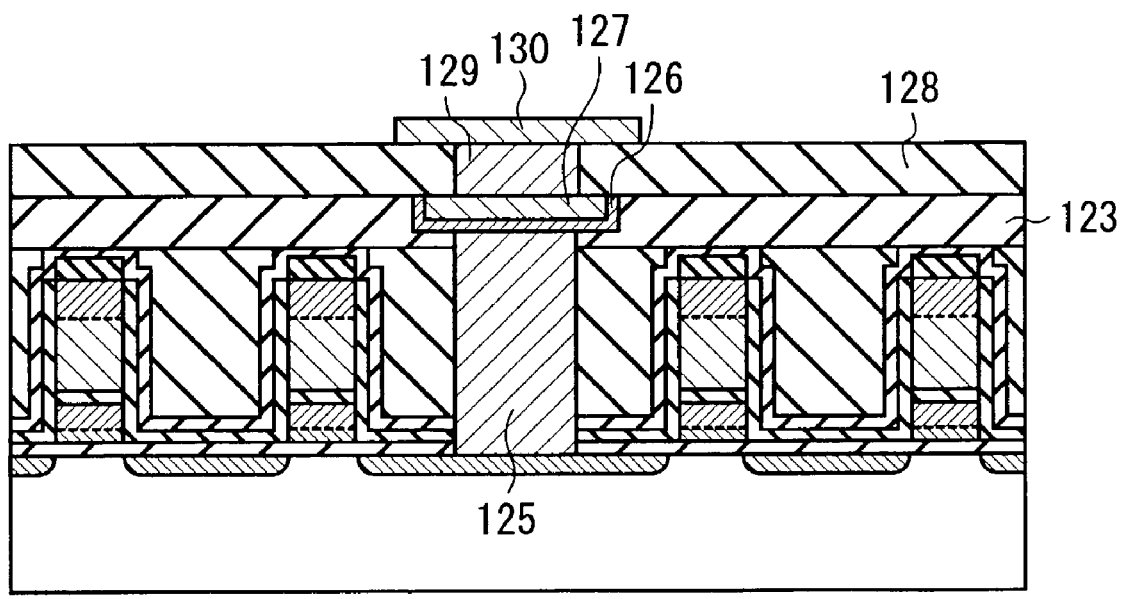
FIG. 23 shows a manufacturing step of a conventional non-volatile semiconductor device followed by FIG. 22.
Figure 24:
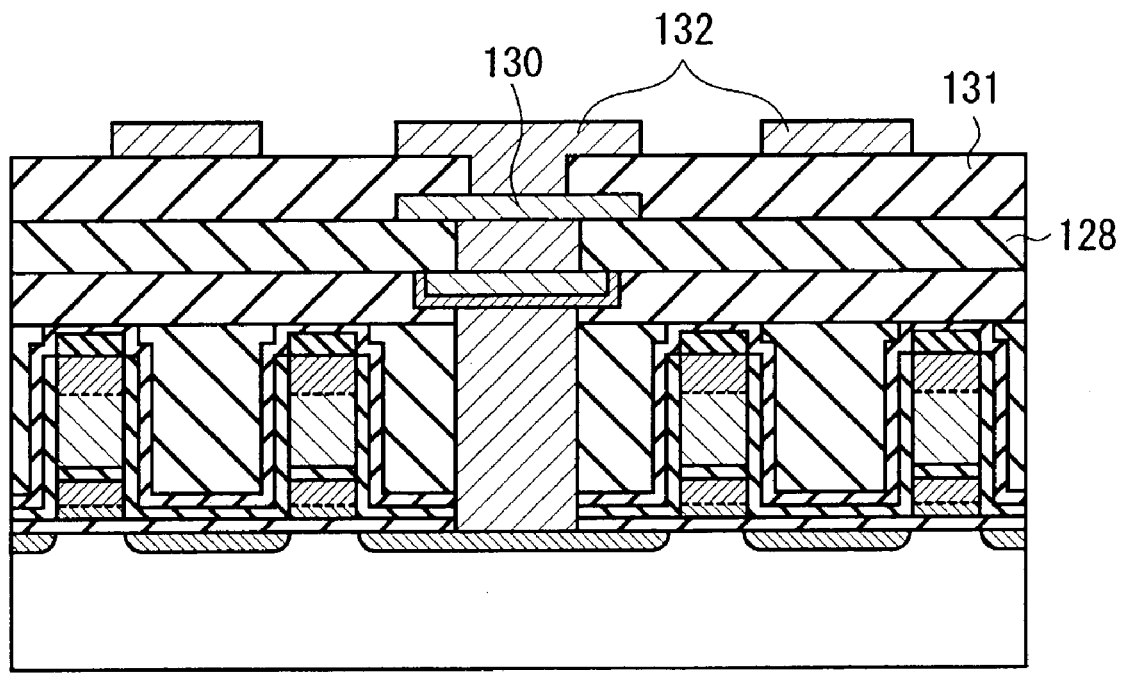
FIG. 24 shows a manufacturing step of a conventional non-volatile semiconductor device followed by FIG. 23.

FIG. 17 shows sectional view of a manufacturing step of the non-volatile semiconductor memory device in the fourth embodiment. Hereinafter, we will explain about manufacturing steps of non-volatile semiconductor memory device in the fourth embodiment. An explanation of the same steps of the fourth embodiment as that of the first to third embodiment would be omitted or simplified.

We will explain about manufacturing steps following that the first metal layer 30 was formed, because manufacturing steps from forming the gate insulation film 12 to forming the insulation film 22 are same as that of the first embodiment (See FIGS. 2, 3, 9, 10, and 14).

As shown in FIG. 17, by using a HDPCVD method, a fifth silicon oxide layer 31 is formed on the fourth silicon oxide layer 28 and the first metal layer 30. After that, by using a CPM method, the fifth silicon oxide layer 31 is flattened. And then, by using a photolithography method, a resist layer (not shown) with a predetermined pattern is formed. A predetermined portion of the fifth silicon oxide layer 31 is removed, thereby exposing a portion of an upper surface of the first metal layer 30. After that, the resist layer with the predetermined pattern is removed. A laminated layer 32' (referred to a third metal layer) comprising a Ti layer/a TiN layer/a Al—Cu layer is formed on the first metal layer 30 and the fifth silicon oxide layer 31. The third metal layer 32' is composed of the Ti layer with, for instance, 25 nm in thickness, the TiN layer with, for instance, 25 nm in thickness, and the Al—Cu layer with, for instance, 800 nm in thickness that are formed in order from the lowest layer. After a resist layer (not shown) with a predetermined pattern is formed by using a photolithography technique, a predetermined portion of the third metal layer 32' is removed by using the patterned resist layer as a mask. It is desirable to provide not only the third layer 32' that is electrically connected to the first metal layer 30, but also conducting layers 39 that are electrically separated.

As shown in FIGS. 16a and 16b, by using a HDPCVD method, a sixth silicon oxide layer 22 with, for instance, 900 nm in thickness is formed on the fifth silicon oxide layer 31 and the third metal layer 32', followed by adding heat with, for instance, 400 degrees centigrade and mixture atmosphere of hydrogen and nitrogen. And then, by using a plasma CVD method, a second silicon nitride layer 34 is formed on the fifth silicon oxide layer 31. A poly imide resin layer 35 is formed on the second silicon nitride layer 34. After annealing with, for instance, 350 degrees centigrade, predetermined portions of the poly imide resin layer 35, the second silicon nitride layer 34, and the sixth silicon oxide layer 33 are removed, thereby exposing a portion of an upper surface of the third metal layer 32'.

The fourth embodiment of the present invention has same effects as the first embodiment of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended and their equivalents.

How to manufacture the line is not limited to the method stated above. Also, a combination structure from the first embodiment to the fourth embodiment could be allowed to use.

Also, in the first to the third embodiments in the present invention, the layer that captures hydrogen or prevents hydrogen from diffusing such as the $Al_2O_3$ layer 10 could be a plurality of layers that captures hydrogen or prevents hydrogen from diffusing.

Also, in the fourth embodiment of the present invention, the first metal layer 30 could be a plurality of layers that captures hydrogen or prevents hydrogen from diffusing. Alternatively, both the fist metal layer and the third metal layer 32' are a plurality of layers that captures hydrogen or prevents hydrogen from diffusing.

Moreover, the embodiments stated above include variety inventions. Therefore, the variety of inventions could be achieved by a combination of a plurality of proper elements disclosed in this specification. For example, even if a few elements in the embodiment are omitted, when the layer captures hydrogen or prevents hydrogen from diffusing into the memory cell, elements excluding the few elements from the embodiment could be an invention.

In the embodiments of the present invention stated above, an non-volatile semiconductor memory device in which a data retention characteristic is improved, could be provided.

Figure 25:
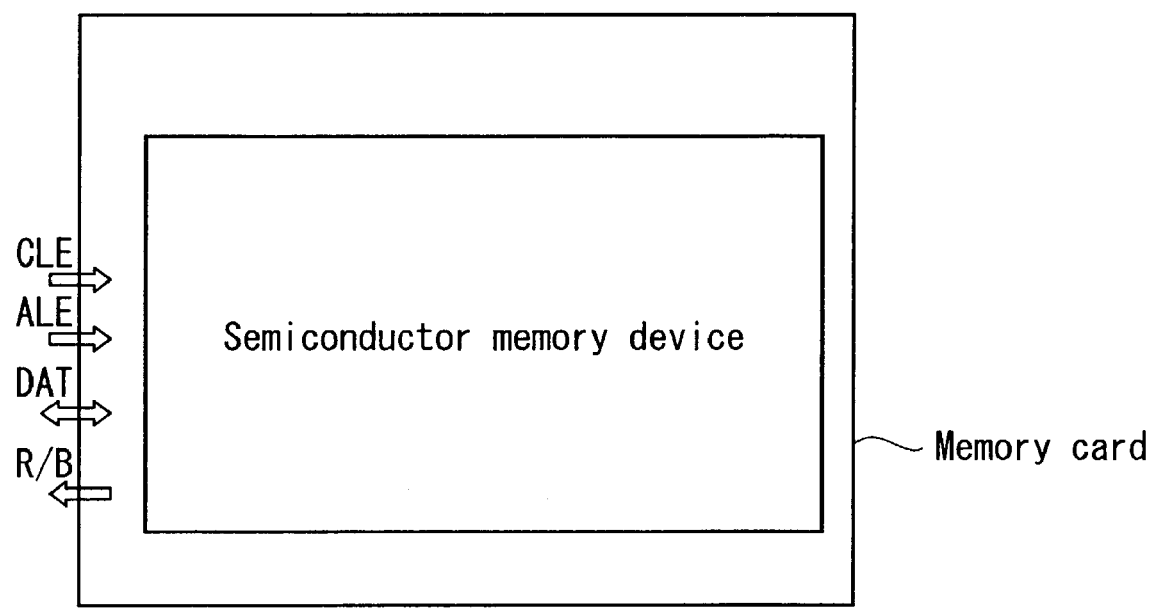
FIG. 25 shows a diagram of a memory card in which a semiconductor memory device is arranged.

We will explain about applications having an above-mentioned semiconductor memory device. A memory card having the above mentioned semiconductor memory device is shown in FIG. 25. As shown in FIG. 25, the semiconductor memory device receives/outputs predetermined signals and data from/to an external device (not shown).

A signal line (DAT), a command line enable signal line (CLE), an address line enable signal line (ALE) and a ready/busy signal line (R/B) are connected to the memory card having the above mentioned semiconductor memory device. The signal line (DAT) transfers data, address or command signals. The command line enable signal line (CLE) transfers a signal which indicates that a command signal is transferred on the signal line (DAT). The address line enable signal line (ALE) transfers a signal which indicates that an address signal is transferred on the signal line (DAT). The ready/busy signal line (R/B) transfers a signal which indicates whether the memory device is ready or not.

Figure 26:
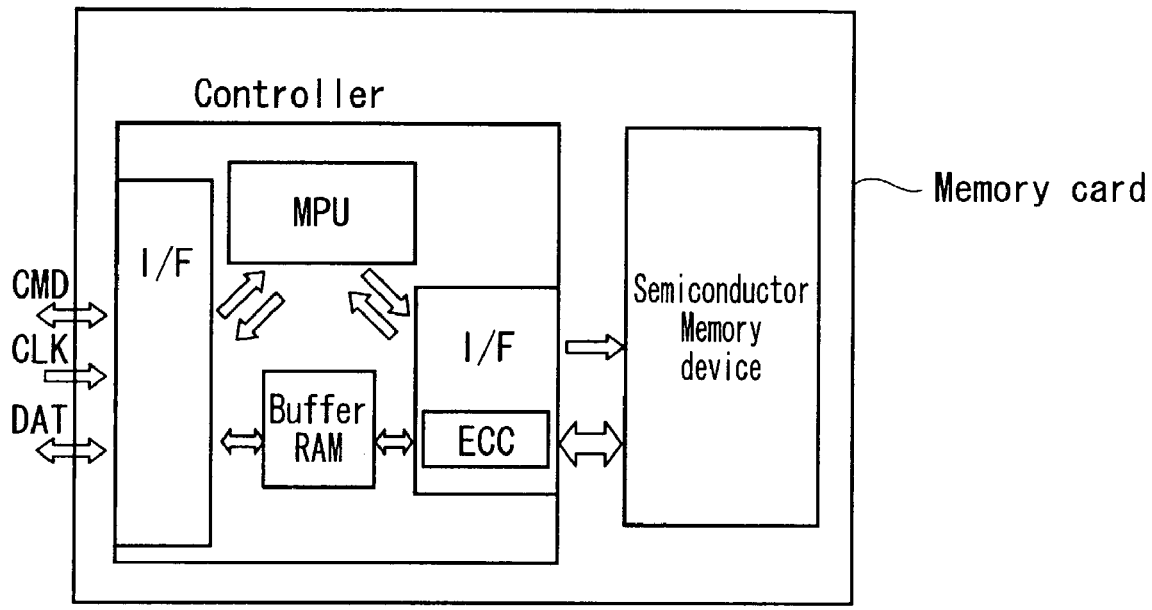
FIG. 26 shows a diagram of a memory card in which a semiconductor memory device and a controller are arranged.

Another example of a memory card is shown in FIG. 26. The memory card shown in FIG. 26 differs from the memory card presented in FIG. 25 in that the memory card includes a controller which controls the semiconductor memory device and receives/transfers predetermined signals from/to an external device (not shown).

The controller includes an interface unit (I/F), a micro processor unit (MPU), a buffer RAM and an error correction code unit (ECC). The interface unit (I/F) receives/outputs predetermined signals from/to an external device (not shown). The micro processor unit converts a logical address into a physical address. The buffer RAM stores data temporarily. The error correction code unit generates an error correction code. And a command signal line (CMD), a clock signal line (CLK) and a signal line (DAT) are connected to the memory card.

Although we explain about the memory cards as shown above, the number of the control signal lines, bit width of the signal line (DAT) and a circuit construction of the controller could be modified suitably.

Figure 27:
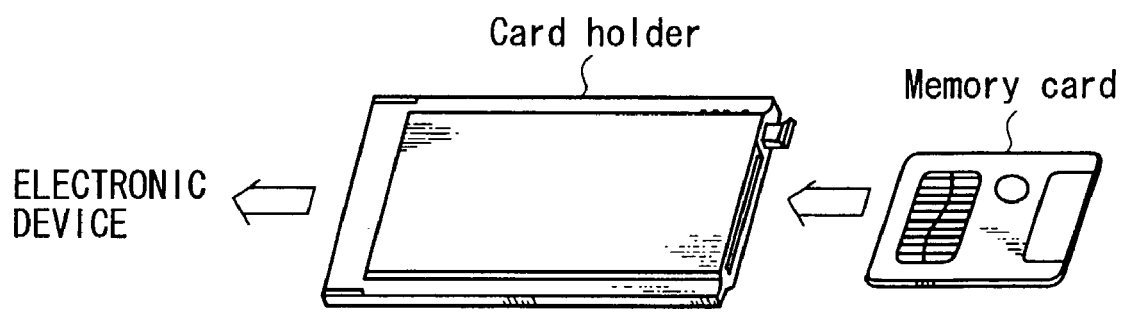
FIG. 27 shows a diagram of a card holder to which a memory card is inserted.

Another application is shown in FIG. 27. A memory card holder to which the memory card is inserted, is shown in FIG. 27. And the card holder is connected to electronic device (not shown). The card holder may have a part of the functions of the controller.

Figure 28:
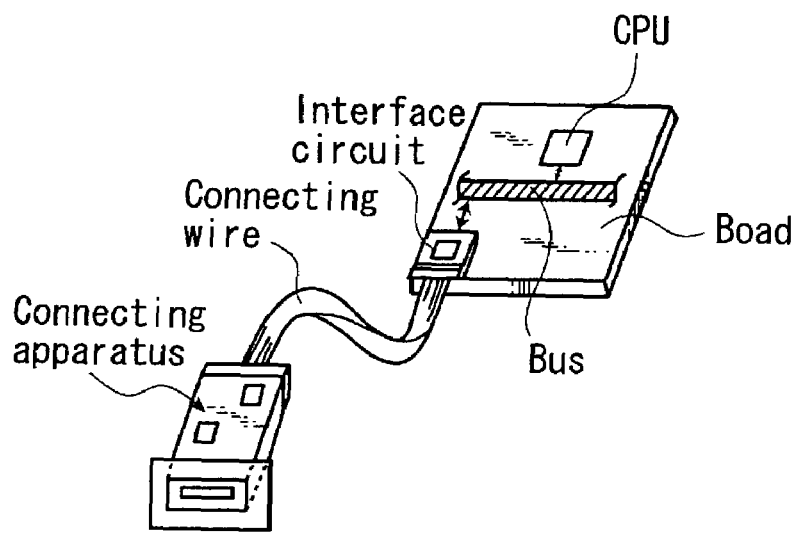
FIG. 28 shows a diagram of a connecting apparatus, a board, and a connecting wire.

Another application is shown in FIG. 28. As shown in FIG. 28, the memory card or the card holder to which the memory card is inserted, is inserted to a connecting apparatus. The connecting apparatus is connected to a board via a connecting wire and an interface circuit. The board has a CPU (Central Processing Unit) and a bus.

Figure 29:
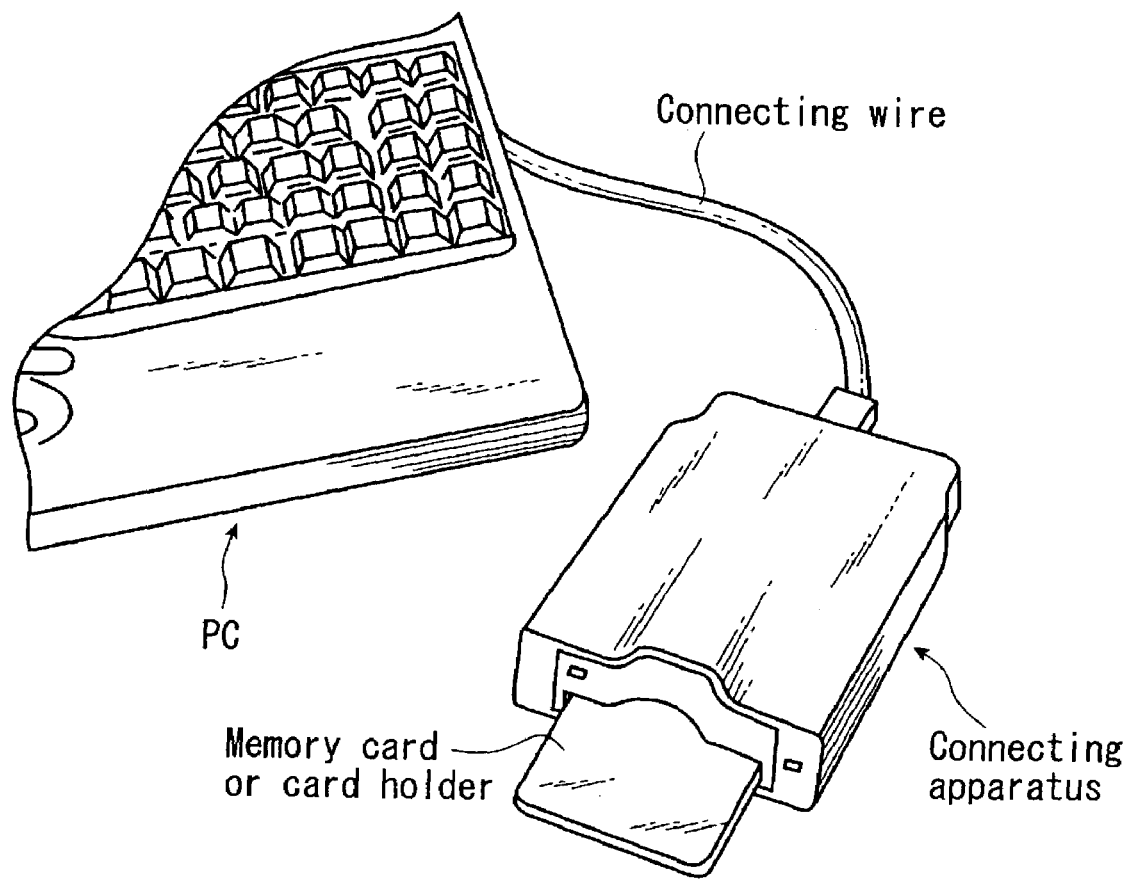
FIG. 29 shows a diagram of a PC, a connecting apparatus, and a connecting wire.

Another application is shown in FIG. 29. As shown in FIG. 29, the memory card or the card holder to which the memory card is inserted, is inserted to a connecting apparatus. The connecting apparatus is connected to PC (Personal Computer) via connecting wire.

Figure 30:
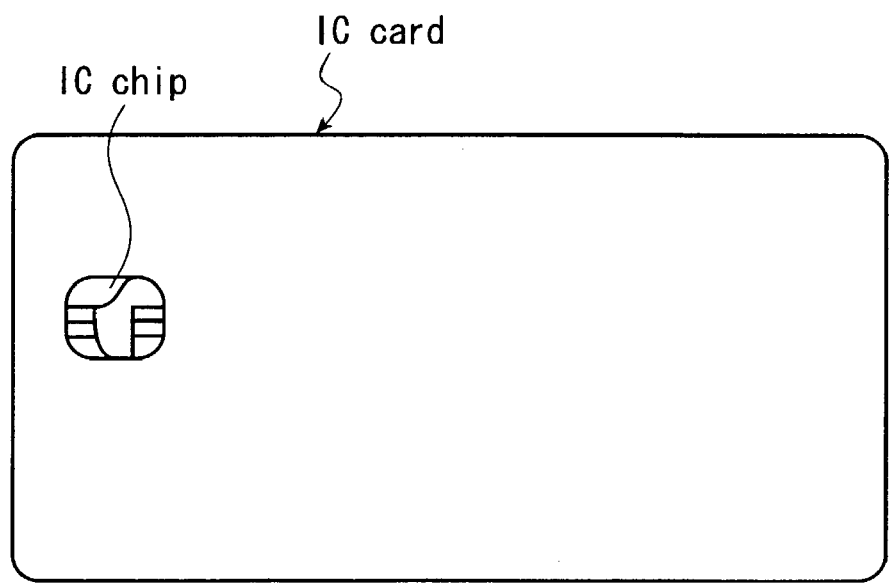
FIG. 30 shows a diagram of an IC chip including a semiconductor memory device, and an IC card on which the IC card is allocated.
Figure 31:
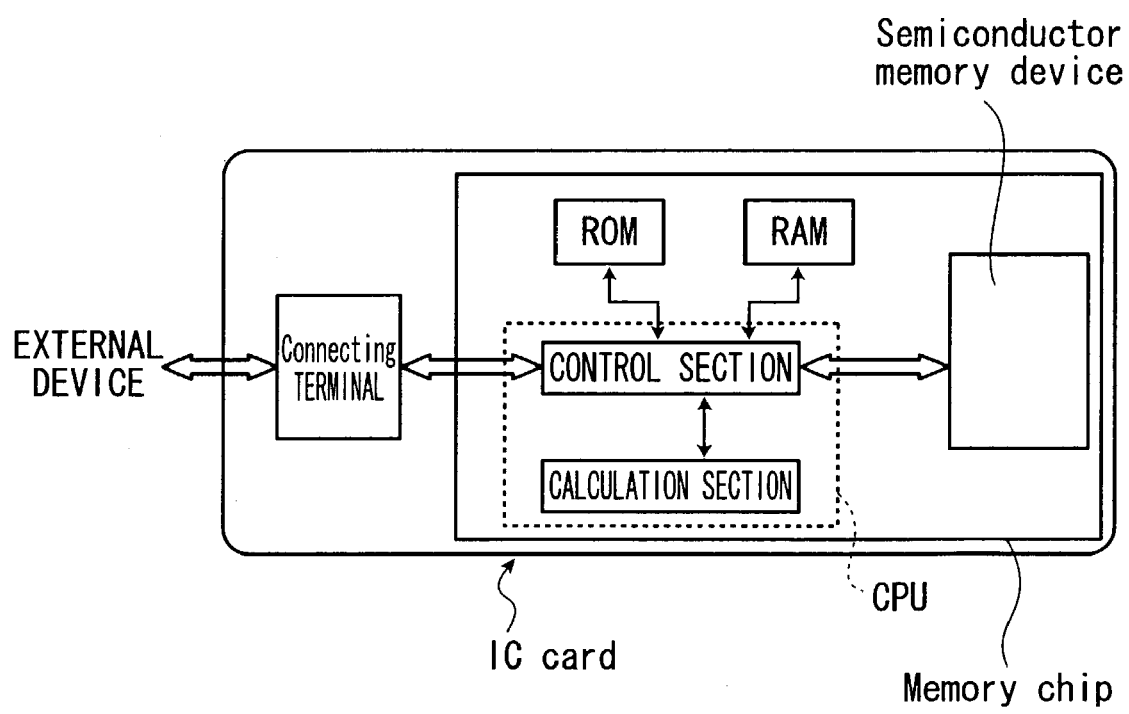
FIG. 31 shows a schematic diagram of an IC card and an IC chip.

Another application is shown in FIGS. 30 and 31. As shown in FIG. 30, An IC chip that includes the above-mentioned semiconductor memory device is located on an IC card that is made of plastic or something like that. FIG. 31 shows a detail block diagram of the IC card and the IC chip presented in FIG. 30. The IC chip has a connecting terminal that is configured to connect to an external device (not shown), and a memory chip that includes the above-mentioned semiconductor memory device, a ROM, a RAM, and a CPU. The CPU contains a calculation section and a control section that is configured to connect to the semiconductor memory device.

What is claimed is:

1. A non-volatile semiconductor memory device, comprising:
    a memory cell having a tunnel oxide layer formed on a semiconductor substrate, a floating gate formed on the tunnel oxide layer, a control gate to which voltage is supplied, a source diffusion layer and a drain diffusion layer, the source and drain diffusion layers formed in the semiconductor substrate adjacent to the tunnel oxide layer;
    a contact layer connected to the drain diffusion layer; and
    a layer formed above the memory cell, the layer comprising at least one of:
        1) a silicon oxide layer to which aluminum are doped,
        2) an aluminum oxide layer,
        3) a silicon oxide layer to which titanium are doped,
        4) a silicon oxide layer to which two of nitrogen, aluminum, and titanium are doped,
        5) a silicon oxide layer to which nitrogen, aluminum, and titanium are doped,
        6) a titanium oxide layer,
        7) a titanium and aluminum oxide layer,
        8) a simple metal layer comprising one of Ti, Ni, Co, Zr, Cu, Pt, V, Mg, U, Nd, La, and Sc,
        9) an alloy layer comprising at least two of Ti, Ni, Co, Zr, Cu, Pt, V, Mg, U, Nd, La, and Sc, and the at least two of Ti, Ni, Co, Zr, Cu, Pt, V, Mg, U, Nd, La, and Sc being included 50% or more,
        10) a nitrogenous layer of the alloy layer, and
        11) a hydrogenated layer of the alloy layer.

2. The non-volatile semiconductor memory device according to claim 1, further comprising a first metal line layer formed above the memory cell, wherein the layer comprising at least one of 1) through 11 is formed between the memory cell and the first metal layer.

3. The non-volatile semiconductor memory device according to claim 1, further comprising a first metal line layer formed above the memory cell, wherein the layer comprising at least one of 1) through 11 is formed above the first metal layer.

4. The non-volatile semiconductor memory device according to claim 1, further comprising a first metal line layer formed above the memory cell and a second metal line layer formed above the first metal line layer, wherein the layer comprising at least one of 1) through 11 is formed between the memory cell and the first metal line layer, between the first metal line layer and the second metal line layer, or above the second metal line layer.

5. The non-volatile semiconductor memory device according to claim 1, wherein electrons are injected into the floating gate through the tunnel oxide layer when a program operation is performed.

6. The non-volatile semiconductor memory device according to claim 1, further comprising a first metal line layer formed above the memory cell and a second metal line layer formed above the first metal line layer, wherein the layer comprising at least one of 1) through 11 is located on one of the first metal line layer and the second metal line layer.

7. The non-volatile semiconductor memory device according to claim 1, wherein the control gate comprises two metal layers electrically connected to each other.

8. The non-volatile semiconductor memory device according to claim 1, further comprising a first metal line layer formed above the memory cell, and a second metal line layer formed in a same level where the first metal line layer is formed and separated electrically from the first metal line layer, wherein the layer comprising at least one of 1) through 11 is located on the first metal line layer and the second metal line layer.

9. The non-volatile semiconductor memory device according to claim 1, further comprising an insulating film formed on a side surface of the control gate.

10. The non-volatile semiconductor memory device according to 1, wherein the non-volatile semiconductor memory device is a NAND type memory cell.

11. The non-volatile semiconductor memory device according to claim 1, wherein the layer comprising at least one of 1) through 11 prevents hydrogen from intruding to the memory cell.

12. The non-volatile semiconductor memory device according to claim 1, further comprising a insulator film formed on the control gate of the memory cell, the layer comprising at least one of 1) through 11 directly formed on the insulator film.

13. A memory device card including the non-volatile semiconductor memory device recited in claim 1.

14. A card holder to which the memory card recited in claim 13 is inserted.

15. A connecting device to which the memory card recited in claim 13 is inserted.

16. The connecting device according to the claim 15, wherein the connecting device is configured to be connected to a computer.

17. A memory card including the non-volatile semiconductor memory device recited in claim 1 and a controller which controls the non-volatile semiconductor memory device.

18. A card holder to which the memory card recited in claim 17 is inserted.

19. A connecting device to which the memory card recited in claim 17 is inserted.

20. The connecting device according to the claim 19, wherein the connecting device is configured to be connected to a computer.

21. An IC card on which an IC chip that includes the non-volatile semiconductor memory device recited in claim 1 is located.

22. A method of manufacturing a non-volatile semiconductor memory device, comprising:
    forming a source diffusion layer and a drain diffusion layer in a semiconductor substrate;
    forming a tunnel oxide layer on the semiconductor substrate adjacent to the source and drain diffusion layers;
    forming a floating gate above the tunnel oxide layer;
    forming a control gate above the floating gate; and
    forming a layer formed above the memory cell, the layer comprising at least one of:
    1) a silicon oxide layer to which nitrogen are doped,
    2) a silicon oxide layer to which aluminum are doped,
    3) an aluminum oxide layer,
    4) a silicon oxide layer to which titanium are doped,
    5) a silicon oxide layer to which two of nitrogen, aluminum, and titanium are doped,
    6) a silicon oxide layer to which nitrogen, aluminum, and titanium are doped,
    7) a titanium oxide layer,
    8) a titanium and aluminum oxide layer,
    9) a simple metal layer comprising one of Ti, Ni, Co, Zr, Cu, Pt, V, Mg, U, Nd, La, and Sc,
    10) an alloy layer comprising at least two of Ti, Ni, Co, Zr, Cu, Pt, V, Mg, U, Nd, La, and Sc, and the at least two of Ti, Ni, Co, Zr, Cu, Pt, V, Mg, U, Nd, La, and Sc being included 50% or more,
    11) a nitrogenous layer of the alloy layer, and
    12) a hydrogenated layer of the alloy layer.

23. The method of manufacturing a non-volatile semiconductor memory device according to claim 22, further comprising: forming a metal line layer either of above the layer comprising at least one of 1) through 12) or between the layer comprising at least one of 1) through 12) and the memory cell.

24. The method of manufacturing a non-volatile semiconductor memory device according to claim 22, further comprising:
    forming a first metal line layer above the memory cell; and
    forming a second metal line layer above the first metal line layer, the layer comprising at least one of 1) through 12) formed either of between the memory cell and the first metal line layer, between the first metal line layer and the second metal line layer, or above the second metal line layer.

25. The method of manufacturing a non-volatile semiconductor memory device according to claim 22, further comprising: forming a metal line layer on the layer comprising at least one of 1) through 12).

26. The method of manufacturing a non-volatile semiconductor memory device according to claim 22, further comprising:
    forming a first metal line layer above the memory cell; and
    forming a second metal line layer above the first metal line layer, the layer comprising at least one of 1) through 12) formed on either of the first metal line layer or the second metal line layer.

27. The method of manufacturing a non-volatile semiconductor memory device according to claim 22, further comprising:
    forming a first metal line layer above the memory cell; and forming a second metal line layer in a same level where the first metal line layer is formed and separated electrically from the first metal line layer, wherein the layer comprising at least one of 1) through 12) is formed on the first metal line layer and the second metal line layer.

28. The method of manufacturing a non-volatile semiconductor memory device according to claim 22, the silicon oxide layer to which the nitrogen is doped is formed by injecting nitrogen atoms into the silicon oxide layer.

29. The method of manufacturing a non-volatile semiconductor memory device according to claim 22, wherein the silicon oxide layer to which the nitrogen is doped is formed by a CVD (Chemical Vapor Deposition) method using with nitrogen gas and without hydrogen gas.

30. The method of manufacturing a non-volatile semiconductor memory device according to claim 22, wherein the silicon oxide layer in which the nitrogen is doped is formed by adding heat with an ammonia atmosphere after the silicon oxide layer was formed.

31. The method of manufacturing a non-volatile semiconductor memory device according to claim 22, wherein the silicon oxide layer in which the nitrogen is doped is formed by a HDPCVD (High Density Plasma Chemical Vapor Deposition) method.

32. The method of manufacturing a non-volatile semiconductor memory device according to claim 22, wherein the silicon oxide layer in which the aluminum is doped is formed by injecting aluminum ions into the silicon oxide layer.

33. The method of manufacturing a non-volatile semiconductor memory device according to claim 22, wherein the silicon oxide layer in which the aluminum is doped is formed by a CVD (Chemical Vapor Deposition) method.

34. The method of manufacturing a non-volatile semiconductor memory device according to claim 22, wherein the silicon oxide layer in which the aluminum is doped is formed by adding heat with an oxygen atmosphere after forming an alloy of aluminum and silicon.

35. The method of manufacturing a non-volatile semiconductor memory device according to claim 22, wherein the silicon oxide layer in which the aluminum is doped is formed by a PVD (Physical Vapor Deposition) method.

36. The method of manufacturing a non-volatile semiconductor memory device according to claim 22, wherein the oxide layer including the aluminum is formed by a CVD (Chemical Vapor Deposition) method.

37. The method of manufacturing a non-volatile semiconductor memory device according to claim 22, wherein the oxide layer including the aluminum is formed by a PVD (Physical Vapor Deposition) method.

38. The method of manufacturing a non-volatile semiconductor memory device according to claim 22, wherein the oxide layer including the aluminum is formed by adding heat with oxygen atmosphere after forming aluminum layer.

39. The method of manufacturing a non-volatile semiconductor memory device according to claim 22, wherein the silicon oxide layer in which the titanium is doped is formed by injecting titanium ions into the silicon oxide layer.

40. The method of manufacturing a non-volatile semiconductor memory device according to claim 22, wherein the silicon oxide layer in which the titanium is doped is formed by a CVD (Chemical Vapor Deposition) method.

41. The method of manufacturing a non-volatile semiconductor memory device according to claim 22, wherein the titanium oxide layer is formed by a CVD (Chemical Vapor Deposition) method.

42. The method of manufacturing a non-volatile semiconductor memory device according to claim 22, wherein the titanium oxide layer is formed by a PVD (Physical Vapor Deposition) method.

43. The method of manufacturing a non-volatile semiconductor memory device according to claim 22, wherein the titanium oxide layer is formed by adding heat with oxygen atmosphere after forming a titanium layer.

44. A method of manufacturing a non-volatile semiconductor memory device, the method comprising
   forming above a memory cell a layer comprising at least one of:
   1) a silicon oxide layer to which aluminum are doped,
   2) an aluminum oxide layer,
   3) a silicon oxide layer to which titanium are doped,
   4) a silicon oxide layer to which two of nitrogen, aluminum, and titanium are doped,
   5) a silicon oxide layer to which nitrogen, aluminum, and titanium are doped,
   6) a titanium oxide layer,
   7) titanium and aluminum oxide layer,
   8) a simple metal layer comprising one of Ti, Ni, Co, Zr, Cu, Pt, V, Mg, U, Nd, La, and Sc,
   9) an alloy layer comprising at least two of Ti, Ni, Co, Zr, Cu, Pt, V, Mg, U, Nd, La, and Sc, and the at least two of Ti, Ni, Co, Zr, Cu, Pt, V, Mg, U, Nd, La, and Sc being included 50% or more,
   10) a nitrogenous layer of the alloy layer, and
   11) a hydrogenated layer of the alloy layer; and producing the device of claim 1.

* * * * *